US006306740B1

(12) United States Patent
Hattori

(10) Patent No.: US 6,306,740 B1
(45) Date of Patent: Oct. 23, 2001

(54) MANUFACTURE OF FIELD EMISSION ELEMENT

(75) Inventor: Atsuo Hattori, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 09/371,177

(22) Filed: Aug. 10, 1999

(30) Foreign Application Priority Data

Aug. 10, 1998 (JP) .................................................. 10-225878

(51) Int. Cl.$^7$ ...................................................... H01L 21/20
(52) U.S. Cl. ............................................... 438/584; 445/24
(58) Field of Search ......................... 445/24, 50; 437/225, 437/228; 438/584, 20

(56) References Cited

U.S. PATENT DOCUMENTS 5,599,749 * 2/1997 Hattori ................................ 437/228
5,629,579 * 5/1997 Zimmerrnan ......................... 313/309

FOREIGN PATENT DOCUMENTS 8-22785 1/1996 (JP) .

OTHER PUBLICATIONS

Low–Voltage Refective View Type FED Panel With Ni–Based Emitter, T. Nakatani et al., (Fujitsu Laboratories Ltd., Hyogo, Japan, FED 1–3), IDW, 1996, pp. 127–130.

* cited by examiner

*Primary Examiner*—David Nelms
*Assistant Examiner*—David Vu
(74) *Attorney, Agent, or Firm*—Ostrolenk, Faber, Gerb & Soffen, LLP

(57) ABSTRACT

In a field emission element manufacture method, a gate electrode having a gate hole and a getter film having a through hole communicating with the gate hole are formed on the surface of a substrate. A sacrificial film is formed over the substrate to form a mold which is used when an emitter electrode is formed, the sacrificial film covering the side walls of the gate hole and through hole and the partial surface of the substrate exposed via the holes. An emitter electrode is formed covering the surface of the mold, and thereafter the gate hole and emitter electrode are exposed to obtain a field emission element. The vacuum degree in a flat panel display can be raised and molecules are prevented from attaching to the surface of the emitter electrode.

44 Claims, 39 Drawing Sheets

MANUFACTURE OF FIELD EMISSION ELEMENT

This application is based on Japanese patent application No. Hei 10-225878 filed on Aug. 10, 1998, the entire contents of which are incorporated herein by reference.

BACKGROUND OF THE INVENTION a) Field of the Invention

The present invention relates to a filed emission element and more particularly to a field emission element having a field emission cathode whose tip emits electrons and its manufacture method.

b) Description of the Related Art

A field emission element emits electrons from a sharp tip of an emitter (field emission cathode) by utilizing electric field concentration. For example, a flat panel display can be structured by using a field emitter array (FEA) having a number of emitters disposed on a substrate. Each emitter controls the luminance of a corresponding pixel of the display.

FIGS. 15A to 15F schematically illustrate a conventional method of manufacturing a field emission element.

As shown in FIG. 15A, a conductive gate electrode 62 is formed on a substrate 61. For example, the conductive gate electrode 62 is made of polysilicon doped with impurities. On the conductive gate electrode 62, a resist film 63 having a predetermined pattern is formed through photolithography.

Next, by using the resist pattern 63 as a mask, the gate electrode 62 is anisotropically etched to leave as shown in FIG. 15B a gate electrode 62*a* having a gate hole 67 having a circular flat shape (as viewed from the top). This etching thins the resist pattern 63 and a thin resist pattern 63*a* is left.

As shown in FIG. 15C, after the resist pattern 63*a* is removed, a sacrificial film 64 is isotropically deposited on the gate electrode 62*a* and on the exposed substrate 61.

Next, as shown in FIG. 15D, the sacrificial film 64 is anisotropically etched to leave a sacrificial film (side spacer) 64*a* on the side wall of the gate hole 67 of the gate electrode 62*a*.

Next, as shown in FIG. 15E, an insulating film 65 is formed on the whole upper surface of the substrate and a conductive emitter electrode 66 is formed on the insulating film 65.

Next, as shown in FIG. 15F, the whole of the substrate 61 and side spacer 64*a* and part of the insulating film 65 are etched to leave a peripheral portion of the insulating film 65*a* between the gate electrode 62*a* and emitter electrode 66.

As a positive potential is applied to the gate electrode to concentrate an electric field upon the tip of the emitter electrode (cathode) 66, electrons can be emitted from the emitter electrode 66 toward an anode electrode (not shown).

FIG. 16 is a cross sectional view of a flat panel display using such field emission elements.

Each field emission element is manufactured by the above-described method, and has an emitter electrode 44 and a gate electrode 45. Formed on a support substrate 41 made of insulating material are a wiring layer 42 made of Al, Cu, or the like and a resistor layer 43 made of polysilicon or the like. On the resistor layer 43, a number of emitter electrodes 44 having a sharp tip are disposed to form a field emitter array (FEA). Each gate electrode 45 has a small opening (gate hole) near at the tip of each emitter electrode 44 and a voltage can be applied independently to each gate electrode although not specifically shown in FIG. 16. A plurality of emitter electrodes 44 can also be independently applied with a voltage.

Facing an electron source including the emitter electrode 44 and gate electrode 45, an opposing substrate is disposed including a transparent substrate 46 made of glass, quartz, or the like. The opposing substrate has a transparent electrode (anode electrode) 47 made of ITO or the like disposed under the transparent electrode 46 and a fluorescent member 48 disposed under the transparent electrode 47.

The electron source and opposing substrate are joined together via a spacer 50 made of a glass substrate and coated with adhesive, with the distance between the transparent electrode 47 and emitter electrode 44 being maintained about 0.1 to 5 mm. The adhesive may be low melting point glass.

Instead of the spacer 50 of a glass substrate, a spacer 50 made of adhesive such as epoxy resin with glass beads being dispersed therein may be used.

An air exhaust pipe 49 is coupled in advance to the opposing substrate. By using this air exhaust pipe 49, the inside of the flat display panel is evacuated to about $1\times10^{-5}$ Torr to $1\times10^{-9}$ Torr (about $1\times10^{-5}\times133.3$ Pa to $1\times10^{-9}\times133.3$ Pa), and then the air exhaust pipe 49 is sealed by using a burner or the like. Thereafter, the anode electrode (transparent electrode) 47, emitter electrode 44, gate electrode 45 are wired to complete the flat panel display.

The anode electrode (transparent electrode) 47 is always maintained at a positive potential. Pixels are selected two-dimensionally by emitter wiring lines and gate wiring lines. Field emission elements are selected disposed at each cross point of voltage applied emitter and gate wiring lines.

The emitter electrode is applied with a negative potential and the gate electrode is applied with a positive potential. Electrons are emitted from the emitter electrode toward the anode electrode. When electrons are bombarded with the fluorescent member 48, fluorescence is radiated from the bombarded area (pixel).

In order to maintain the inside of the flat panel display at a high vacuum degree, a getter member 51 is provided at the corner in the flat panel display. For example, the getter member 51 is made of Ti, Ta, Zr, Al, Mg, or the like. After the air exhaust pipe 49 is sealed, the getter member 51 is activated by heating it with a lamp or laser beam to adsorb ambient molecules therein. The initial vacuum degree in the flat panel display can therefore be improved.

Other molecules such as He passing through the transparent substrate 46 and support substrate 41 and entering the inside of the flat panel display or other molecules such as $H_2O$, $O_2$, and $N_2$ emitted in the flat panel display are also adsorbed by the getter member 51. As a result, the vacuum degree in the flat panel display is prevented from being lowered and the flat panel display is prolonged its lifetime.

The getter member 51 is disposed at the corner in the flat panel display so as not to obstruct electrons to be emitted from the emitter electrode 44 toward the transparent electrode 47. The getter member 51 is therefore placed at the position remote from the emitter electrodes 44. As the getter member 51 is placed remotely from the emitter electrodes 44, the function of the getter member 51 cannot be sufficiently demonstrated and the following disadvantages may occur.

(1) Molecules described above are attached to the surface of the emitter electrode 44 in a high electric field, before they are adsorbed by the getter member 51. Radiation current (electron flow) from the emitter electrode 44 therefore reduces.

(2) As molecules attach to or emit from the surface of the emitter electrode 44, a magnitude of the radiation current from the emitter electrode 44 fluctuates and becomes unstable.

(3) As the emitter electrode 44 is bombarded with ions, the emitter electrode 44 is sputtered and the tip of the emitter electrode 44 deforms. As the tip of the emitter electrode 44 is rounded, an electric field is hard to be concentrated and the performance of the field emission element is degraded.

(4) In order to maintain a high vacuum degree during the long span of one to ten years, a getter member 51 having a large area is required. As the large area getter member 51 is used, the flat panel display becomes large and the fluorescence radiation area (display area) becomes relatively small.

SUMMARY OF THE INVENTION

It is an object of the present invention to provide a field emission element and a manufacture method thereof capable of improving the vacuum degree in the flat panel display and preventing molecules from being attached to the emitter surface.

According to one aspect of the present invention, there is provided a method of manufacturing a field emission element including a process of forming a lamination of a gate electrode and a getter film on a substrate.

In the field emission element, the gate electrode and getter film are laminated. The getter film in a flat panel display using such field emission elements is activated so that the vacuum degree near at the gate electrode can be raised. Since the gate electrode is generally positioned near at the tip of the emitter electrode, the vacuum degree near at the emitter electrode tip can also be raised.

DETAILED DESCRIPTION OF THE PREFERRED EMBODIMENTS

Figure 1A:
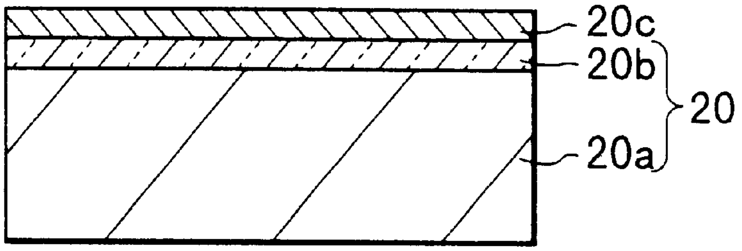
FIGS. 1A to 1O are schematic cross sectional views illustrating the manufacture steps of a field emission element (two-electrode element) according to a first embodiment of the invention.
Figure 1B:
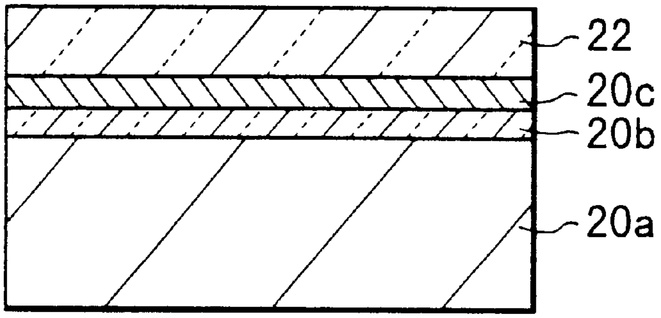
Figure 1C:
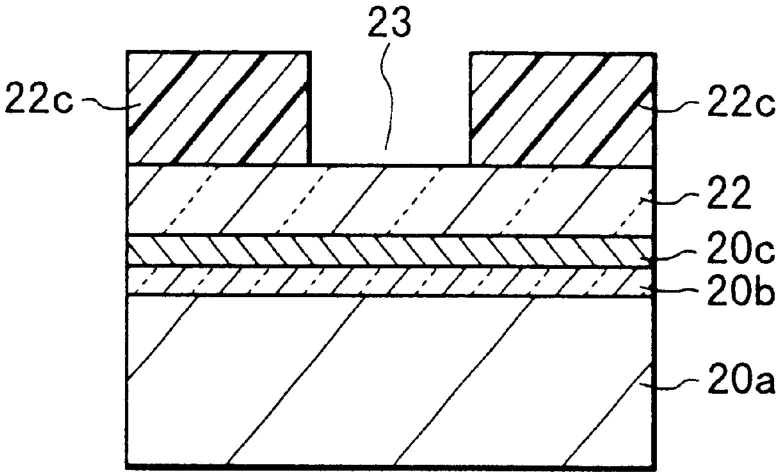
Figure 1D:
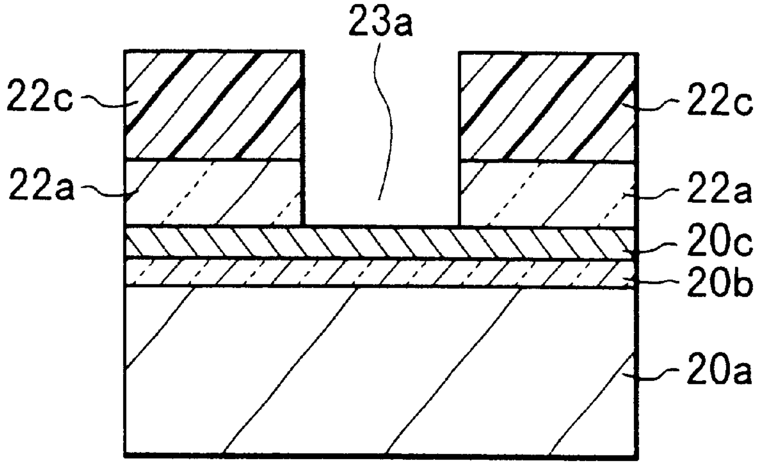
Figure 1E:
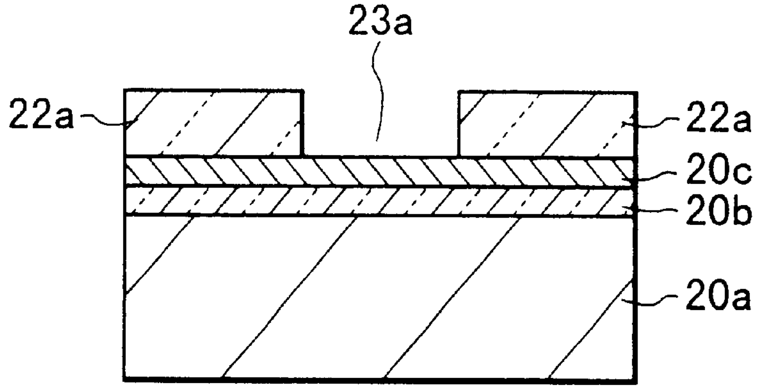
Figure 1F:
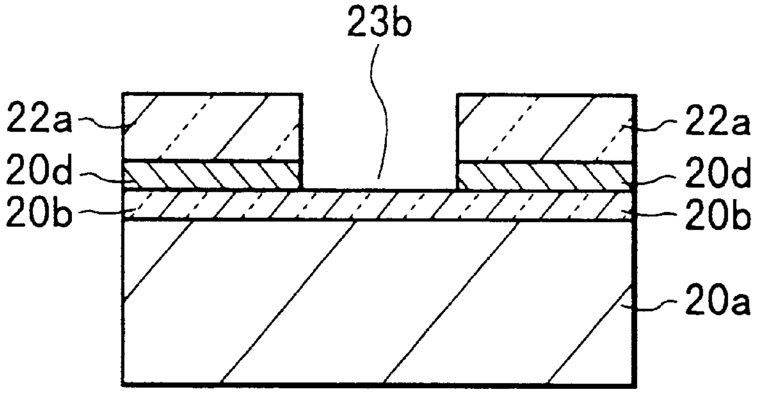
Figure 1G:
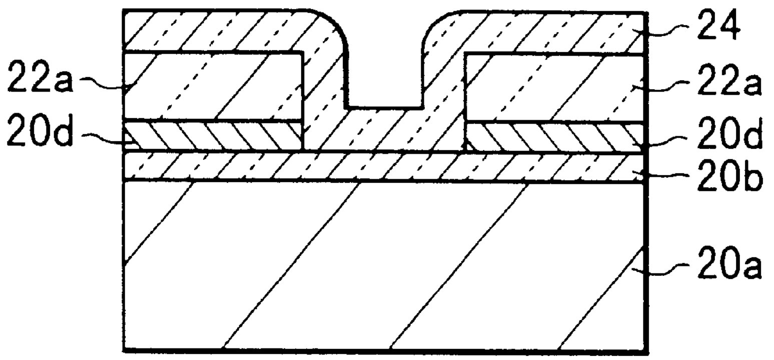
Figure 1H:
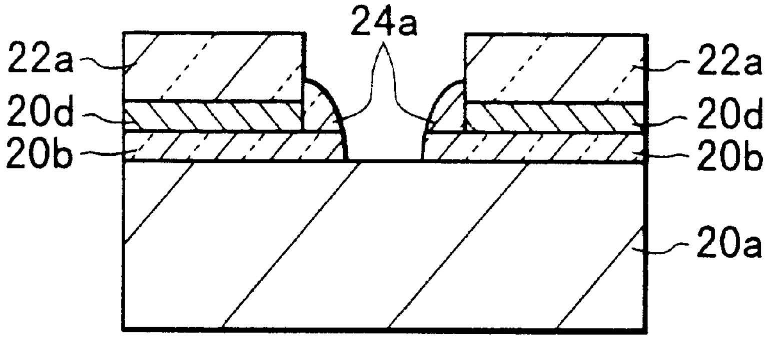
Figure 1I:
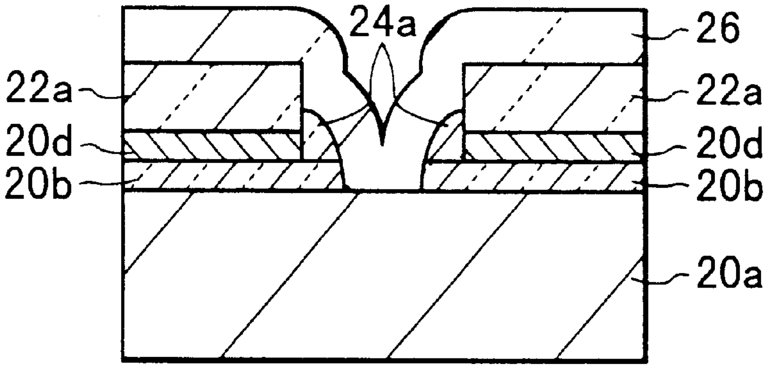
Figure 1J:
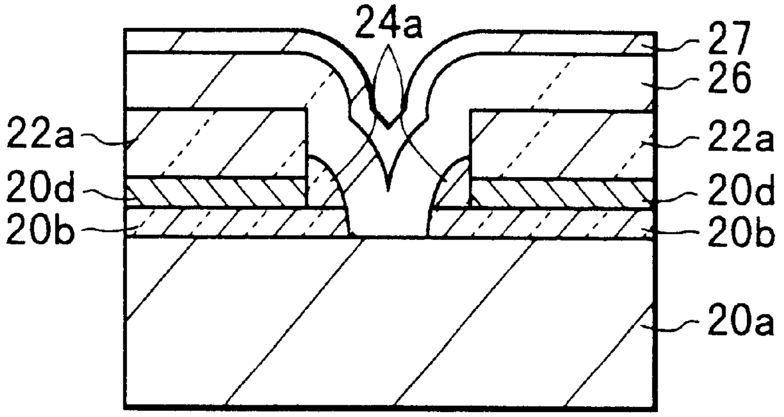
Figure 1K:
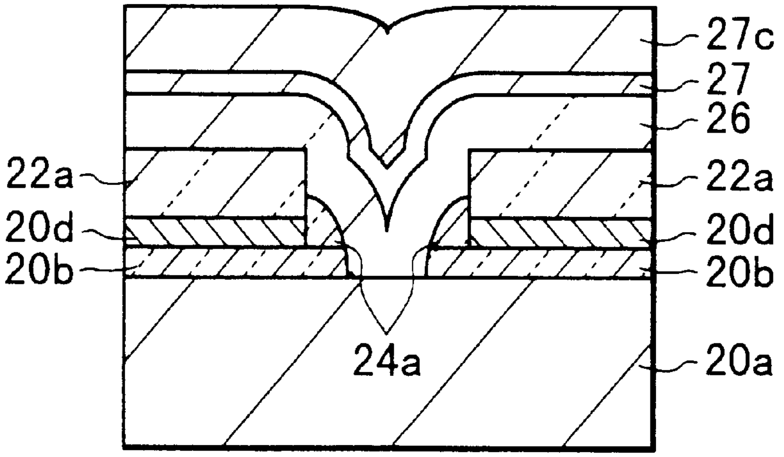
Figure 1L:
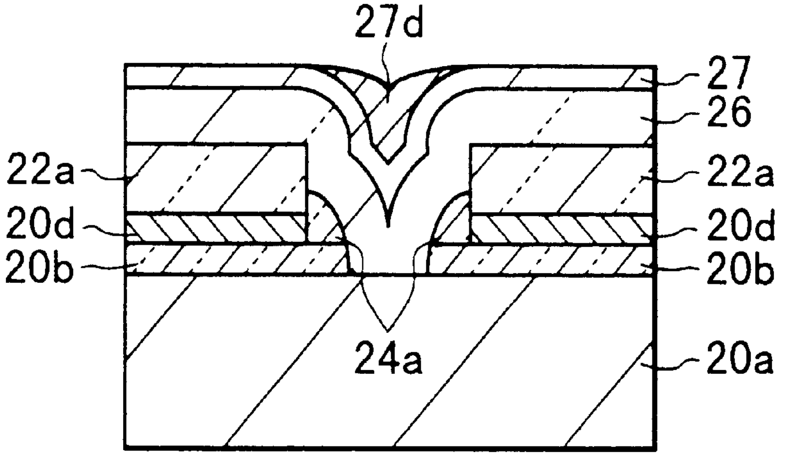
Figure 1M:
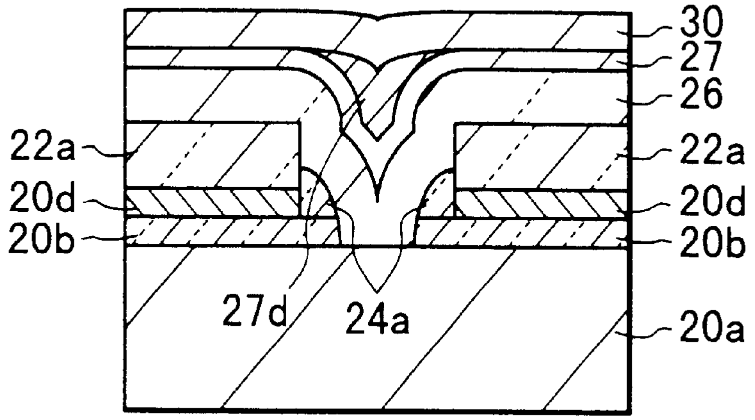
Figure 1N:
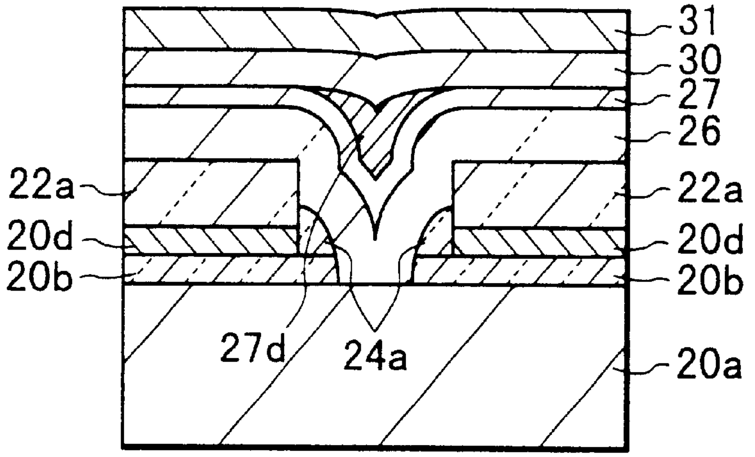
Figure 1O:
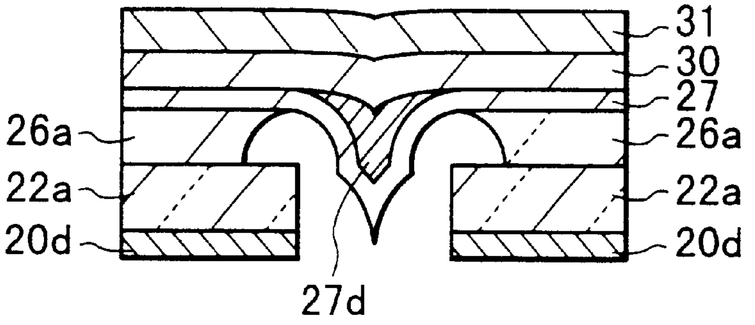

FIGS. 1A to 1O are schematic cross sectional views illustrating the manufacture steps of a field emission element (two-electrode element) according to the first embodiment of the invention. A two-electrode element has an emitter electrode and a gate electrode.

As shown in FIG. 1A, a substrate 20 is made of a starting substrate 20*a* and a first lamination film 20*b* formed thereon. By thermally oxidizing the starting substrate 20*a* made of Si, the first lamination film 20*b* made of $SiO_2$ can be formed 0.05 $\mu$m thick.

For the thermal oxidation, for example, wet (water vapor) oxidation is performed in a vertical diffusion furnace at a hydrogen flow rate of 19 slm, an oxygen flow rate of 19 slm, and a temperature of 1000° C.

Next, a getter material layer 20*c* of Ti is deposited on the first lamination film 20*b* to a thickness of 0.05 $\mu$m by sputtering. This sputtering is performed in a DC sputtering system using Ti as a target while Ar gas is introduced.

Next, as shown in FIG. 1B, a first sacrificial film (antireflection film) 22 of $SiN_x$ is deposited on the getter material layer 20*c* to a thickness of 0.12 $\mu$m by reactive sputtering. The antireflection film 22 has an antireflection function for i-line ray at the surface of the getter material layer 20*c*. Sputtering for the antireflection film ($SiN_x$ film) 22 is performed in an RF sputtering system by using Si as a target while $N_2$+Ar gas is introduced. $SiN_x$ may be used as the target while Ar gas is introduced. The $SiN_x$ film may be formed by plasma CVD.

Next, as shown in FIG. 1C, a resist film 22*c* having a predetermined pattern is formed on the antireflection film 22 by photolithography, the resist film 22*c* having a hole 23. More specifically, a resist film is first coated on the whole surface of the antireflection film 22 and then the resist film 22*c* having a predetermined pattern is formed through selective exposure and development.

The antireflection film 22 can lower the intensity of reflection light during exposure because of light absorption of this film 22 itself and/or interference between reflected light from the surface of this film 22 and reflected light from the underlying layer. Since reflection light hardly exposes an undesired area, the resist film 22*c* having a predetermined pattern can be formed at a high resolution.

The hole 23 has a generally vertical side wall (inner wall) and has a circular plan shape (as viewed from the top) having a diameter of 0.5 μm.

Next, as shown in FIG. 1D, by using the resist film 22*c* as a mask, the antireflection film 22 is anisotropically etched to leave an antireflection film 22*a* having a predetermined pattern with a hole 23*a*. This hole 23*a* has a generally vertical side wall (inner wall) and has a circular plan shape (as viewed from the top) having a diameter of 0.5 μm. The antireflection film 22*a* has two parts (laterally separated regions) as viewed in section of FIG. 1D. Since the resist film 22*c* was formed at a high resolution, the antireflection film 22*a* having a predetermined pattern can be formed also at a high resolution.

For example, etching the antireflection film 22*a* is performed in a magnetron RIE system by using $CHF_3$+$CO_2$+Ar as etching gas under the conditions of a magnetic field of 5 G (Gauss), a reaction chamber pressure of 60 mTorr (about $60\times10^{-3}\times133.3$ Pa), a cooling He pressure of 8 Torr (about 8×133.3 Pa) and an RF power of 500 W.

Next, as shown in FIG. 1E, the resist pattern 22*c* is removed to expose the upper surface of the antireflection film 22*a*.

Next, as shown in FIG. 1F, by using the antireflection film 22*a* as a mask, the getter material layer 20*c* is etched to form a getter film 20*d* having a predetermined pattern with a hole 23*b*. As will be later described, the hole 23*b* corresponds to a gate hole. By forming this hole 23*b*, a gate electrode made of the getter film 20*d* can be formed. Since the resist film 22*c* and antireflection film 22*a* were formed at a high resolution, the getter film 20*d* can be formed also at a high resolution.

For example, etching the getter material layer 20*c* is performed in a magnetron RIE system having a susceptor with a gas cooling mechanism, under the conditions of a $Cl_2$ gas flow rate of 40 sccm, a pressure of 100 mTorr (about $100\times10^{-3}\times133.3$ Pa), an Rf power of 250 W, a magnetic field of 50 G (Gauss), and a cooling He pressure of 4 Torr (about 4×133.3 Pa).

It is not limited only to that the getter material layer 20*c* is etched by using only the antireflection film 22*a* as a mask. The getter material layer 20*c* may be etched by using the antireflection film 22*a* and resist film 22*c* formed on the antireflection film 22*a*, without removing the resist film 22*c*. In this case, the resist film 22*c* is removed thereafter.

Next, as shown in FIG. 1G, a second sacrificial film (insulating film) 24 of $SiO_2$ is deposited over the whole upper surface of the substrate to a thickness of 0.15 μm by atmospheric pressure CVD. For example, the atmospheric pressure CVD is performed by using $O_3$ and TEOS (tetraetoxysilane, $(C_2H_5O)_4Si$) as source gas at a substrate temperature of 400° C.

Next, as shown in FIG. 1H, the second sacrificial film 24 is anisotropically dry-etched (etched back) to leave a second sacrificial film 24*a* as a side spacer only on the side walls of the antireflection film 22*a* and getter film 20*d*. The "side wall" means a side wall of a hole formed by photolithography and etching, this definition being applied also in the following description. This etching exposes the upper area of the side wall of the antireflection film 22*a*. The upper surface of the starting substrate 20*a* is exposed and an etching process stops at the upper surface of the starting substrate 20*a*.

For example, this etching is performed in a magnetron RIE system by using $CHF_3$+$CO_2$+Ar as etching gas under the conditions of a reaction chamber pressure of 50 mTorr (about $50\times10^{-3}\times133.3$ Pa), a $CHF_3/CO_2$/Ar flow rate of 60/10/30 (sccm), a substrate cooling He pressure of 8 Torr (about 8×133.3 Pa), a magnetic field of 30 G (Gauss), and an RF power of 700 W.

Next, as shown in FIG. 1I, a third sacrificial film (insulating film) 26 of $SiO_2$ is isotropically deposited over the whole upper surface of the substrate to a thickness of 0.15 μm by atmospheric pressure CVD. The third sacrificial film 26 is deposited on the surfaces of the antireflection film 22*a*, side spacer 24*a*, first lamination film 20*b* and starting substrate 20*a*, inheriting (conformal to) the surface topology. The surface topology of the third sacrificial film 26 has curves of two stages. The first stage (upper) curve is dependent on the corner shape of the antireflection film 22*a* and the second stage (lower) curve is dependent on the surface shape of the side spacer 24*a*.

A cusp on the surface of the third sacrificial film 26 has an acute angle like a contact point between two circles or ellipses. This cusp is used as a mold for forming a two-stage shaped emitter electrode.

The "two-stage shaped emitter electrode" in this specification means an emitter electrode having a first circumferential surface continuous with the tip and a second circumferential surface continuous with the first circumferential surface, and a contour line of the first circumferential surface and the second circumferential surface, as viewed in vertical cross section of the emitter electrode, have different gradients at the boundary between the contour lines.

Next, as shown in FIG. 1J, an emitter electrode 27 of, for example, $TiN_x$, is deposited on the third sacrificial film 26 to a thickness of about 0.05 μm by reactive sputtering. This reactive sputtering is performed in a DC sputtering system by using Ti as a target while gas of $N_2$+Ar is introduced.

Figure 15A:
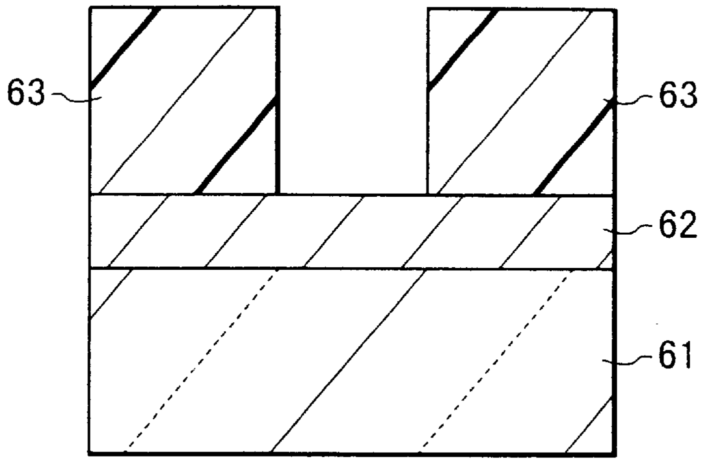
FIG.15A PRIOR ART
FIGS. 15A to 15F are schematic cross sectional views illustrating the conventional manufacture steps of a field emission element.
Figure 15B:
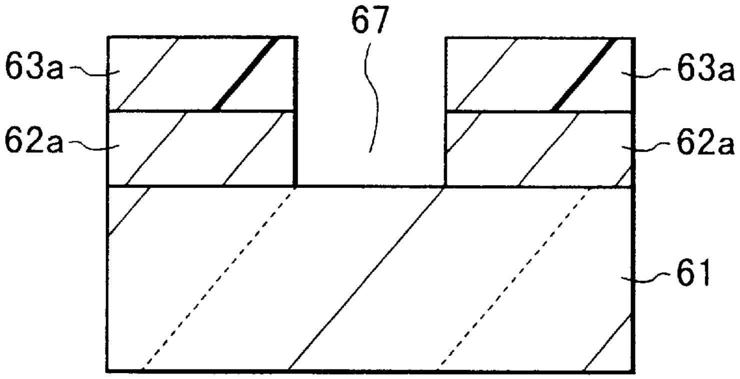
FIG.15B PRIOR ART
Figure 15C:
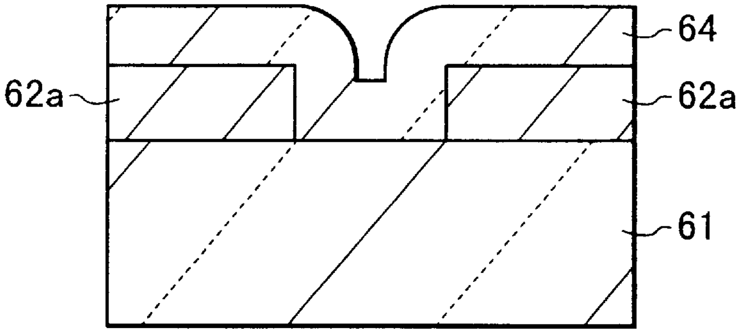
FIG.15C PRIOR ART
Figure 15D:
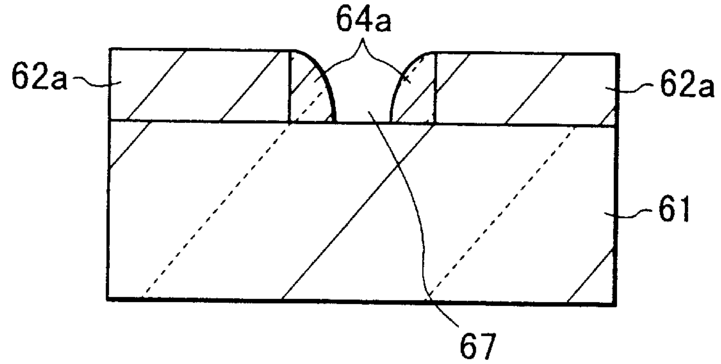
FIG.15D PRIOR ART
Figure 15E:
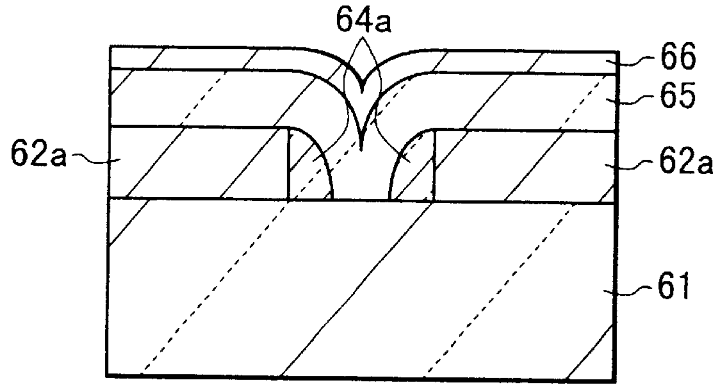
FIG.15E PRIOR ART
Figure 15F:
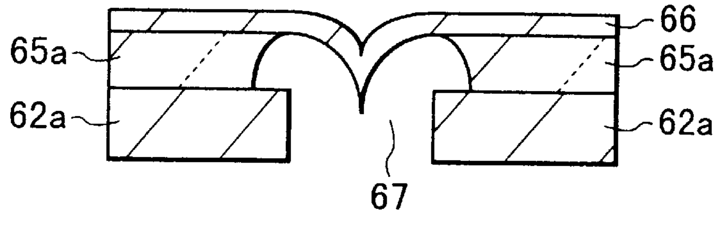
FIG.15F PRIOR ART

With this embodiment, a two-stage shaped emitter electrode 27 can be formed. It is easy to make the tip of the two-stage shaped emitter electrode have a smaller radius of curvature than that of the one-stage shaped emitter electrode shown in FIG. 15F. As the radius of curvature of the emitter electrode tip is made small, an electric field can be easily concentrated upon the emitter electrode tip and the performance of the field emission element can be improved.

Next, as shown in FIG. 1K, a blanket film (second emitter electrode) 27*c* of W (tungsten) is deposited on the emitter electrode (first emitter electrode) 27 to a thickness of 0.2 μm by CVD. For example, this CVD is performed by using $WF_6$+$H_2$+$N_2$+Ar gas as work gas at a pressure of 80 Torr (about 80×133.3 Pa) and a temperature of 450° C.

Next, as shown in FIG. 1L, the blanket film 27*c* of W (tungsten) is etched back 0.2 μm thick by using an RIE etcher to leave a blanket film 27*d* only in a surface recess of the emitter electrode 27 to planarize the surface of the emitter electrode 27. For example, this RIE (reactive ion etching) is performed in a magnetron RIE system by using $SF_6$+Ar+He as etching gas at a reaction chamber pressure of 280 mTorr (about $280\times10^{-3}\times133.3$ Pa).

Next, as shown in FIG. 1M, a resistor layer 30 of Si is deposited about 0.2 μm thick by sputtering, covering the emitter electrode 27 and blanket film 27*d*. By serially connecting the resistor layer 30 to the emitter electrode 27, the emission current of the emitter electrode (field emission cathode) 27 can be stabilized sufficiently.

For example, sputtering for the resistor layer (Si) 30 is performed in a DC sputtering system by using Si as a target while Ar gas is introduced. Instead of Si, high resistance material such as $SiN_x$, $SiO_x$ and $SiO_xN_y$ may be used as the material of the resistor layer 30. In this case, instead of Ar gas, sputtering is performed by using $N_2$+Ar gas, $O_2$+Ar gas or $N_2+O_2$+Ar gas.

Next, as shown in FIG. 1N, an emitter wiring layer 31 of Al is deposited on the resistor layer 30 to a thickness of 0.3 μm by sputtering. This sputtering is performed in a DC sputtering system by using Al as a target while Ar gas is introduced.

Lastly, as shown in FIG. 1O, the whole of the starting substrate 20*a*, first lamination film 20*b* and side spacer 24*a* and part of the third sacrificial film 26 are etched and removed from the bottom side, to leave a peripheral third sacrificial film 26*a* and expose the tip of the emitter electrode 27. The getter film 20*d* surrounds the tip of the emitter electrode 27.

For etching Si of the starting substrate 20*a* and the like, $HF+HNO_3+CH_3COOH$ is used, and for etching $SiO_2$ of the third sacrificial film 26 and the like, $HF+NH_4F$ is used.

With the above processes, a field emission element (two-electrode element) having the two-stage shaped emitter electrode 27 is completed. Since the getter film (Ti film) 20*d* is a conductive film, it can function as the gate electrode. This field emission element has the emitter electrode 27 and gate electrode 20*d*.

The emitter electrode 27 is applied with a negative potential and an unrepresented anode electrode is applied with a positive potential. As a positive potential is applied to the gate electrode 20*d*, electrons can be emitted from the emitter electrode 27 toward the anode electrode.

Figure 16:
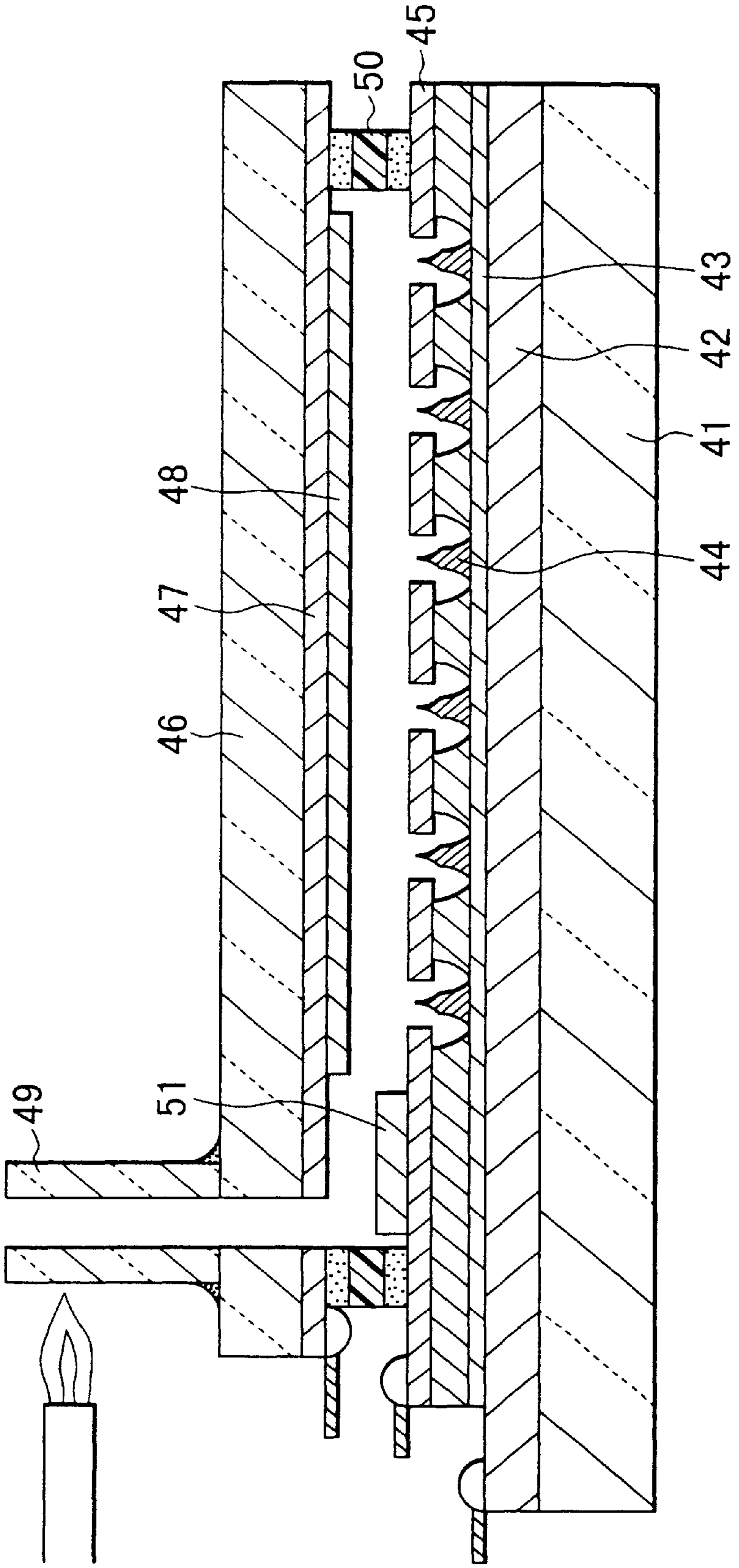
FIG. 16 is a schematic cross sectional view of a flat panel display using field emission elements.

After field emission elements are manufactured, a flat panel display such as shown in FIG. 16 is manufactured by the method similar to that described earlier. However, the getter member 51 shown in FIG. 16 is not necessary. After or before the inside of the flat display panel is evacuated and the air exhaust pipe is sealed, the getter film 20*d* (refer to FIG. 1O) of field emission elements is activated by heating them with a lamp or laser beam or by other light application, so that ambient molecules can be adsorbed. In this manner, the vacuum degree in the flat panel display can be improved.

Other molecules such as He passing through the transparent substrate and support substrate and entering the inside of the flat display panel or other molecules such as $H_2O$, $O_2$, and $N_2$ emitted in the flat panel display are also adsorbed by the getter film 20*d*. As a result, the vacuum degree in the flat panel display is prevented from being lowered and the flat panel display is prolonged its lifetime.

The getter member 51 shown in FIG. 16 is disposed at the corner in the flat panel display, remotely from the emitter electrodes, so that the function of the getter member cannot be sufficiently demonstrated.

According to the embodiment, the getter film 20*d* surrounds near the tip of the emitter electrode so that the following advantages can be obtained.

(1) The getter film 20*d* adsorbs molecules near the emitter electrode 27 and prevents molecules from attaching the surface of the emitter electrode 27. Since the vacuum degree near at the emitter electrode 27 is improved, radiation current (electron flow) from the emitter electrode 27 can be prevented from being reduced.

(2) Since the vacuum degree near the emitter electrode 27 can be improved, a magnitude of the radiation current of the emitter electrode 27 can be prevented from fluctuating.

(3) Since the vacuum degree near the emitter electrode 27 can be improved, it is possible to prevent the emitter electrode 27 from being deformed through sputtering with ions.

(4) Since the getter film 20*d* is formed in the field emission element, the size of the flat panel display can be made smaller than when the getter member is provided remotely from field emission elements.

(5) The uniformity and reproductivity of characteristics of field emission elements in each flat display panel and between flat display panels can be improved. Flicker to be caused by luminance differences of a flat display panel can be reduced.

FIGS. 2A to 2F are schematic cross sectional views illustrating other manufacture steps of the field emission element (two-electrode element) according to the first embodiment of the invention.

Figure 2A:
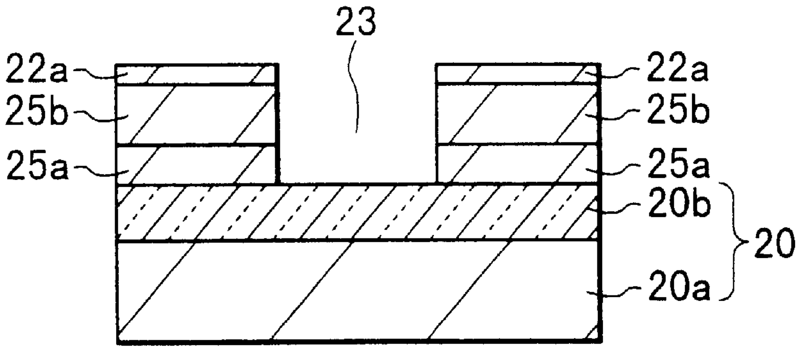
FIGS. 2A to 2F are schematic cross sectional views illustrating the manufacture steps of a field emission element (two-electrode element) according to a modification of the first embodiment of the invention.

As shown in FIG. 2A, similar to the first embodiment, by photolithography and etching, a first lamination film 20*b* of $SiO_2$ is formed on a starting substrate 20*a* of Si, and a first gate electrode 25*a*, a second gate electrode 25*b* and a getter film 22*a* respectively having a predetermined pattern are sequentially formed on the first lamination film 20*b*.

More specifically, on the surface of the starting substrate 20*a* of Si, the first lamination film 20*b* is formed through thermal oxidation. On the first lamination film 20*b*, a first gate electrode film is deposited by CVD to a thickness of 0.15 μm, the first gate electrode film being made of polysilicon doped with P (phosphorous) or B (boron). On the first gate electrode film, a second gate electrode film of $WSi_x$ is deposited by CVD to a thickness of 0.15 μm. On the second gate electrode film, a first sacrificial film (getter material layer) of Ti is deposited by sputtering to a thickness of 0.04 μm. Thereafter, by photolithography and etching, the first and second gate electrode films and getter material layer are patterned. This patterning process forms a hole 23 through the getter material layer and first and second gate electrode films, the hole 23 reaching the surface of the first lamination film 20*d*. A hole formed through the first and second gate electrode films corresponds to the gate hole. Namely, this patterning process forms a two-layer structure gate electrode constituted of the first gate electrode 25*a* made of the first gate electrode film with a gate hole and the second gate electrode 25*b* made of the second gate electrode film with a gate hole. This patterning process also forms the getter film 22*a* shown in FIG. 2A.

Sputtering for the getter material layer (Ti layer) is performed in a DC sputtering system by using Ti as a target while Ar gas is introduced. Instead of Ti, the getter film 22*a* may be made of Ta or Zr (zirconium).

In the first embodiment (refer to FIG. 1O), the getter film is formed as the gate electrode. In this modification of the first embodiment, the getter film 22*a* is formed over the gate electrodes 25*a* and 25*b*.

Figure 2B:
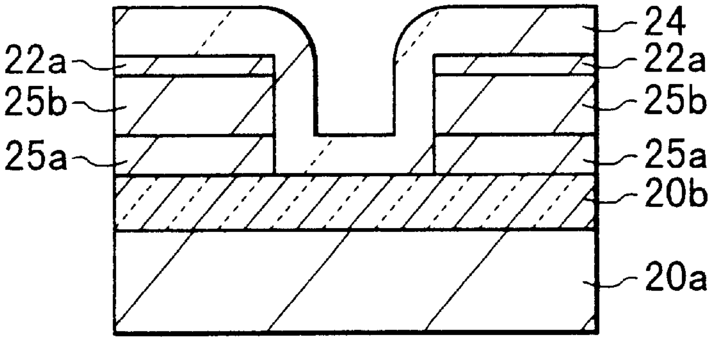

Next, as shown in FIG. 2B, a second sacrificial film (insulating film) 24 of $SiO_2$ is isotropically deposited over the whole upper surface of the substrate to a thickness of 0.15 μm by atmospheric pressure CVD.

Figure 2C:
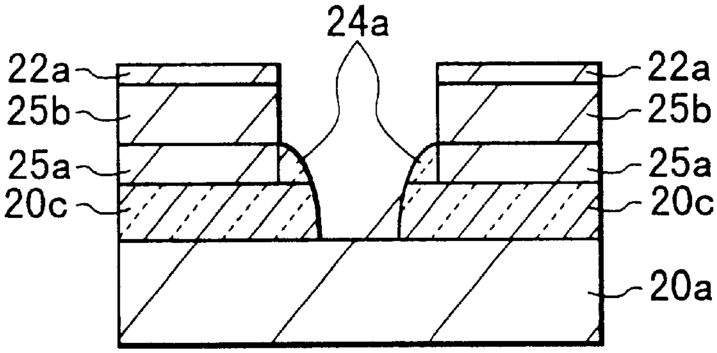

Next, as shown in FIG. 2C, the second sacrificial film 24 is anisotropically dry-etched to leave a second sacrificial film 24*a* as a side spacer only on the side wall of the first gate electrode 25*a*. This etching process exposes the side walls of the getter film 22*a* and second gate electrode 25*b* and a partial surface area of the first lamination film (etching stopper film) 20. For example, this etching is performed in a magnetron RIE system by using $CHF_3+CO_2$+Ar as etching gas under the conditions of a $CHF_3/CO_2$/Ar flow ratio of 60/10/30 (sccm), a reaction chamber pressure of 50 mTorr (about $50\times10^{-3}\times133.3$ Pa), a substrate cooling He pressure of 8 Torr (about $8\times133.3$ Pa), a magnetic field of 30 G, and an RF power of 700 W.

Figure 2D:
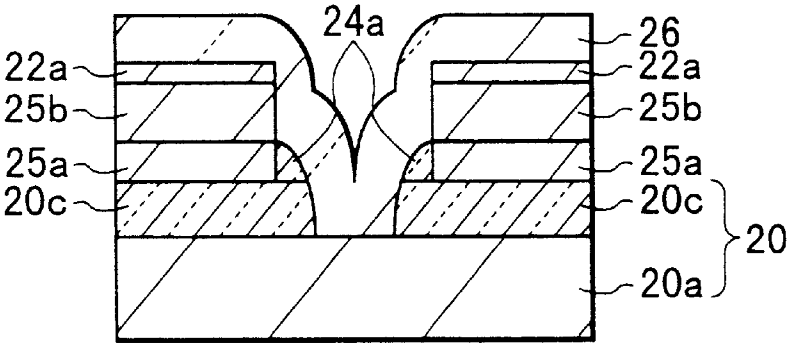

Next, as shown in FIG. 2D, a third sacrificial film (insulating film) 26 of $SiO_2$ is isotropically deposited over the whole upper surface of the substrate to a thickness of 0.15 μm by atmospheric pressure CVD. The third sacrificial film 26 is deposited on the surfaces of the starting substrate 20*a*, first lamination film 20*c*, side spacer 24*a*, second gate electrode 25*b* and getter film 22*a*, being conformal to the surface topology. The surface topology of the third sacrificial film 26 has curves of two stages. This surface of the third sacrificial film 26 is used as a mold for forming a two-stage shaped emitter electrode.

Figure 2E:
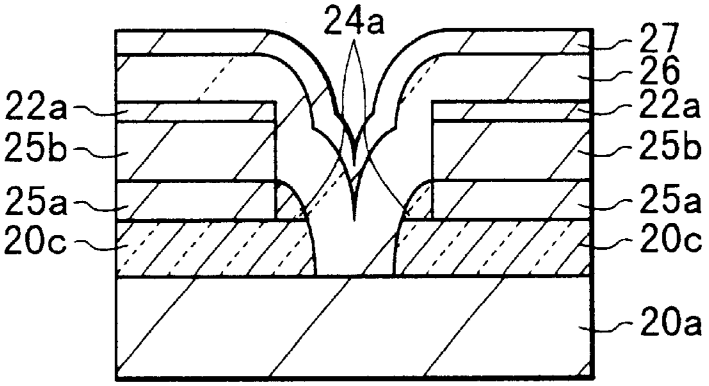

Next, as shown in FIG. 2E, an emitter electrode 27 of, for example, $TiN_x$, is deposited on the third sacrificial film 26 to a thickness of about 0.05 μm by reactive sputtering. This reactive sputtering is performed in a DC sputtering system by using Ti as a target while gas of $N_2$+Ar is introduced.

Figure 2F:
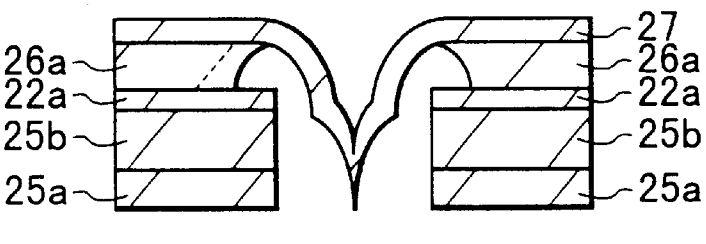

Next, as shown in FIG. 2F, the whole of the starting substrate 20*a*, first lamination film 20*c* and side spacer 24*a* and part of the third sacrificial film 26 are etched and removed from the bottom side, to leave a peripheral third sacrificial film 26*a* and expose the tip of the emitter electrode 27.

For etching Si of the starting substrate 20*a* and the like, $HF+HNO_3+CH_3COOH$ is used, and for etching $SiO_2$ of the third sacrificial film 26 and the like, $HF+NH_4F$ is used.

With the above processes, a field emission element (two-electrode element) having the two-stage shaped emitter electrode 27 is completed. Since the getter film (Ti film) 22*a* is a conductive film, it can function as the gate electrode together with the first and second gate electrodes 25*a* and 25*b*. This field emission element has the emitter electrode 27 and gate electrodes 25*a*, 25*b* and 22*a*. The getter film 22*a* is formed over the gate electrodes 25*a* and 25*b* and surrounds near the tip of the emitter electrode 27.

Similar to the first embodiment, after field emission elements are manufactured, a flat panel display such as shown in FIG. 16 is manufactured. After or before the air exhaust pipe of the flat panel display is sealed, the getter film 22*a* of field emission elements is activated by heating them with a lamp or laser beam or by other light application, so that ambient molecules can be adsorbed.

For example, light may be applied to the gate electrodes 25*a* and 25*b* to heat them and heat the getter film 22*a* through heat conduction. If the getter film 22*a* made of a Ti film or the like is heated to 400° C. or higher, it can be activated. Light is preferably applied to the substrate along a direction perpendicular to the substrate surface. However, it may be applied obliquely. The getter film 22*a* may be activated by baking the substrate in a furnace.

FIGS. 3A to 3D are schematic cross sectional views illustrating four methods of reinforcing the emitter electrode 27 by a support substrate 28. Since the emitter electrode 27 has a small thickness of about 0.2 μm it may preferably be reinforced with the support substrate 28.

Figure 3A:
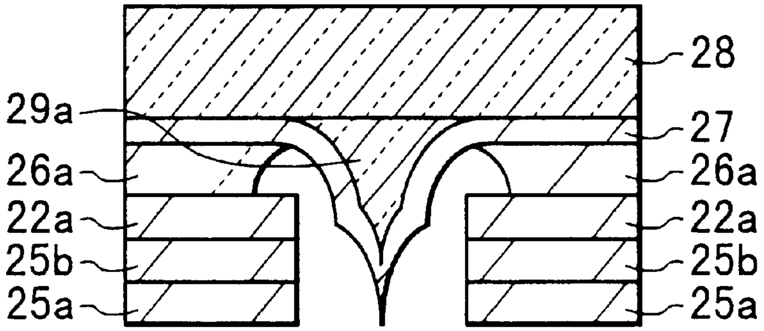
FIGS. 3A to 3D are schematic cross sectional views illustrating the methods of reinforcing an emitter electrode by using a support substrate.

FIG. 3A illustrates the first method. A recess of the emitter electrode 27 of the field emission element manufactured to the state shown in FIG. 2E is filled with a planarizing film 29*a*, e.g., an SOG (spin on glass) film. Thereafter, the planarizing film 29*a* is etched back through CMP (chemical-mechanical polishing) or RIE to planarize the surface of the emitter electrode 27. Instead of an SOG film, the planarizing film 29*a* may be formed by reflowing PSG (phosphosilicate glass) or BPSG (borophosphosilicate glass).

Next, a support substrate 28 is bonded to the emitter electrode by electrostatic bonding or with adhesive. The support substrate 28 is made of, for example, glass, quartz, or $Al_xO_y$ (alumina or sapphire). Thereafter, similar to the process shown in FIG. 2F, the substrate 20*a* and the like are removed to expose the tip of the emitter electrode 27 as shown in FIG. 3A.

Figure 3B:
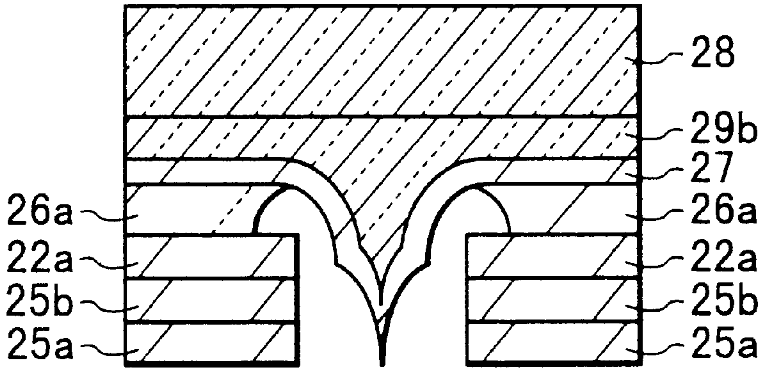

FIG. 3B illustrates the second method. In the state of the field emission element shown in FIG. 2E, adhesive 29*b* made of, e.g., low melting point glass or epoxy resin is flowed on the emitter electrode 27 to bond the emitter electrode 27 and a support substrate 28. The adhesive 29*b* also provides a function of planarizing the surface of the emitter electrode 27. Thereafter, similar to the process shown in FIG. 2F, the substrate 20*a* and the like are removed to expose the tip of the emitter electrode 27 as shown in FIG. 3B.

Figure 3C:
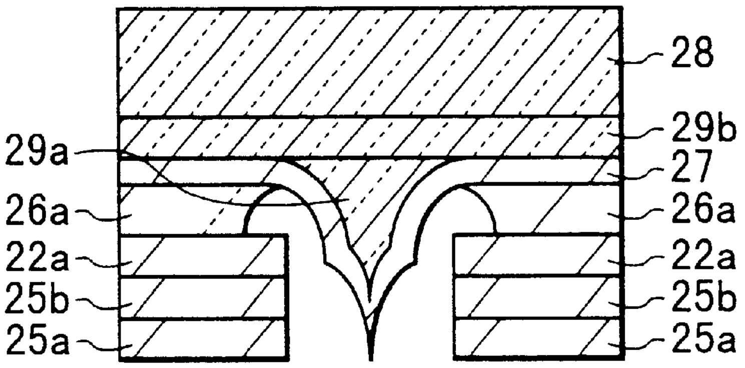

FIG. 3C illustrates the third method. After the field emission element shown in FIG. 2E is manufactured, a recess of the emitter electrode 27 is filled with a planarizing film 29*a* made of, for example, SOG. Thereafter, the planarizing film 29*a* is etched back to planarize the surface of the emitter electrode 27. Next, an adhesive layer 29*b* made of, for example, Al, is formed on the emitter electrode 27, and a support substrate 28 is bonded. Thereafter, similar to the process shown in FIG. 2F, the substrate 20*a* and the like are removed to expose the tip of the emitter electrode 27 as shown in FIG. 3C.

Figure 3D:
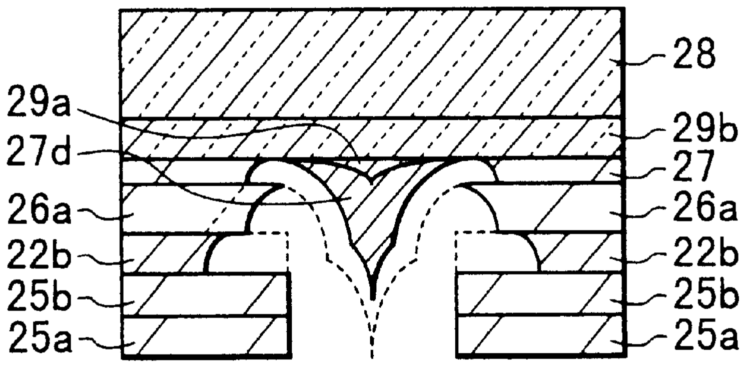

FIG. 3D illustrates the fourth method. Similar to the processes shown in FIGS. 1K and 1L, after the blanket film (second emitter electrode) 27*c* of W is formed on the emitter electrode (first emitter electrode) 27 to a thickness of 0.2 μm by CVD, the blanket film 27*c* is etched back 0.2 μm thick by using an RIE etcher to leave the blanket film 27*d*. Similar to the process shown in FIG. 3C, a recess of the blanket film 27*d* is filled with a planarizing film 29*a* such as SOG and thereafter the planarizing film 29*a* is etched back to planarize the surface of the blanket film 27*d*. Next, the emitter electrode 27, blanket film 27*d* and planarizing film 29*a* are bonded to a support substrate 28 with adhesive 29*b*. Thereafter, similar to the process shown in FIG. 2F, the substrate 20*a* and the like are removed while the getter film 22 is wet-etched, to leave a peripheral getter film 22*b* and expose the tip of the emitter electrode 27 as shown in FIG. 3D.

Etching the getter film 22*a* of Ti is performed by using a mixture solution of sulfuric acid and hydrogen peroxide, while the mixture solution is heated to about 120° C. In place of the mixture solution of sulfuric acid and hydrogen peroxide, the etching may be performed by using hydrochloric acid, phosphoric acid or hydrofluoric acid.

FIGS. 4A to 4F are schematic cross sectional views illustrating the manufacture steps of a field emission element (two-electrode element) according to a modification of the first embodiment of the invention.

Figure 4A:
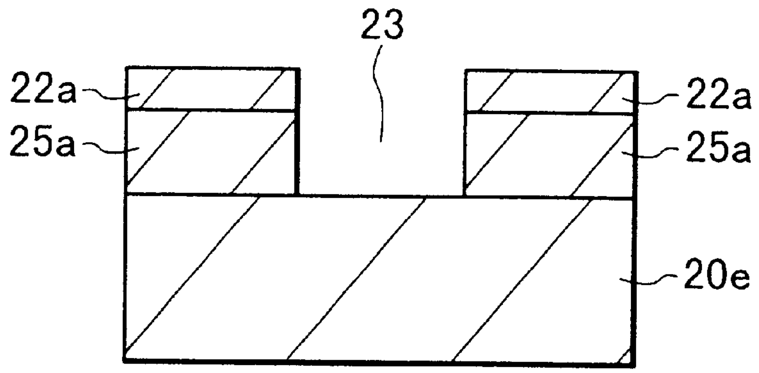
FIGS. 4A to 4F are schematic cross sectional views illustrating the manufacture steps of a field emission element (two-electrode element) according to another modification of the first embodiment of the invention.

As shown in FIG. 4A, similar to the first embodiment, by photolithography and etching, a gate electrode 25*a* and a first sacrificial film (getter film) 22*a* having a predetermined pattern are formed on a starting substrate 20*e*. The gate electrode 25*a* has a gate hole 23.

More specifically, on the surface of the starting substrate 20*e* of Si, a gate electrode film of $WSi_x$ is deposited to a thickness of 0.3 μm by sputtering, and on the gate electrode film a getter material layer of Ti is deposited to a thickness of 0.05 μm by sputtering. Thereafter, by photolithography and etching, the gate electrode film and getter material layer are patterned. This patterning process forms the getter film 22*a* and gate electrode 25*a* shown in FIG. 4A. The getter film (Ti film) 22*a* is formed on the gate electrode ($WSi_x$ film) 25*a*.

For example, this etching process is performed in a magnetron RIE system by using $Cl_2$ as etching gas under the conditions of a reaction chamber pressure of 100 mTorr (about $100\times10^{-3}\times133.3$ Pa), a $Cl_2$ gas flow of 40 sccm, a substrate cooling He pressure of 4 Torr (about 4×133.3 Pa), a magnetic field of 50 G, and an RF power of 250 W.

Sputtering for the gate electrode film ($WSi_x$ film) is performed in a DC sputtering system by using $WSi_x$ as a target while Ar gas is introduced. Sputtering for the getter material layer (Ti film) is performed in a DC sputtering system using Ti as a target while Ar gas is introduced.

Figure 4B:
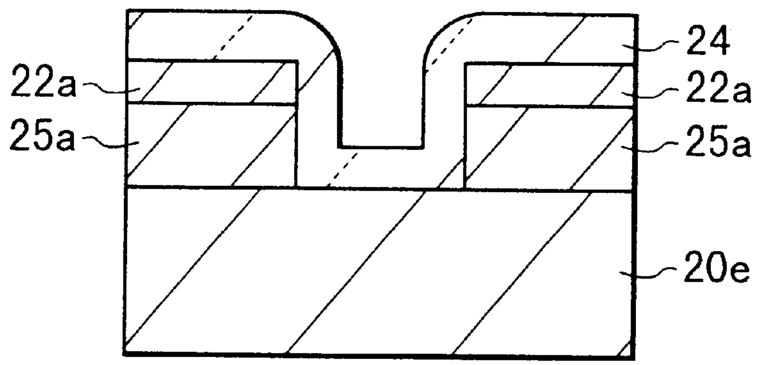

Next, as shown in FIG. 4B, a second sacrificial film (insulating film) 24 of $SiO_2$ is isotropically deposited over the whole upper surface of the substrate to a thickness of 0.15 $\mu$m by atmospheric pressure CVD.

Figure 4C:
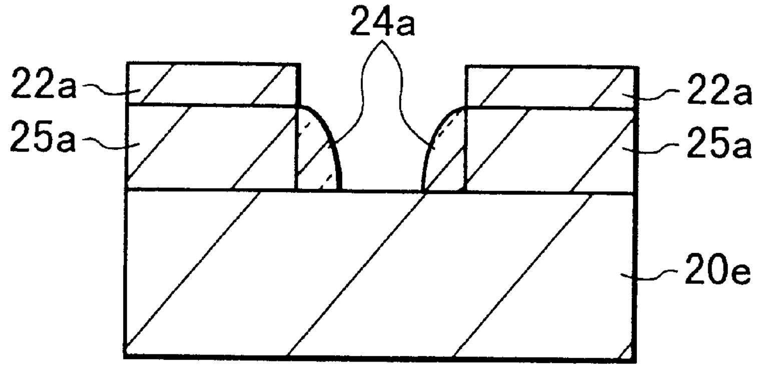

Next, as shown in FIG. 4C, the second sacrificial film 24 is anisotropically dry-etched to leave a second sacrificial film 24*a* as a side spacer only on the side wall of the gate electrode 25*a* and/or the side wall of the getter film 22*a*. This etching process exposes the side wall of the getter film 22*a* and a partial surface of the starting substrate 20*e*.

For example, this etching is performed in a magnetron RIE system by using $CHF_3+CO_2+Ar$ as etching gas under the conditions of a reaction chamber pressure of 50 mTorr (about $50\times10^{-3}\times133.3$ Pa), a $CHF_3/CO_2/Ar$ flow ratio of 60/10/30 (sccm), a substrate cooling He pressure of 8 Torr (about 8×133.3 Pa), a magnetic field of 30 G, and an RF power of 700 W.

Figure 4D:
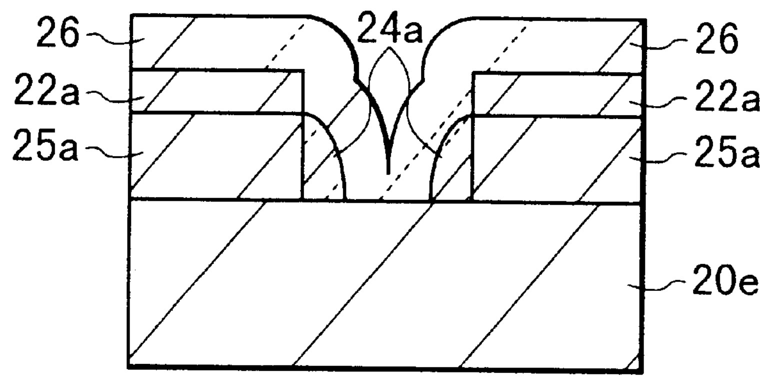

Next, as shown in FIG. 4D, a third sacrificial film (insulating film) 26 of $SiO_2$ is isotropically deposited over the whole upper surface of the substrate to a thickness of 0.15 $\mu$m by atmospheric pressure CVD. The third sacrificial film 26 is deposited on the surfaces of the starting substrate 20*e*, side spacer 24*a* and getter film 22*a*, being conformal to the surface topology. The surface topology of the third sacrificial film 26 has curves of two stages. This surface of the third sacrificial film 26 is used as a mold for forming a two-stage shaped emitter electrode.

Figure 4E:
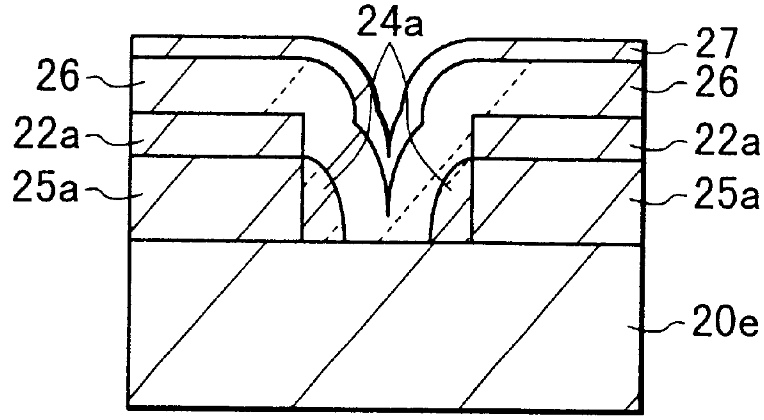

Next, as shown in FIG. 4E, an emitter electrode 27 of, for example, $TiN_x$, is deposited on the third sacrificial film 26 to a thickness of about 0.05 $\mu$m by reactive sputtering.

Figure 4F:
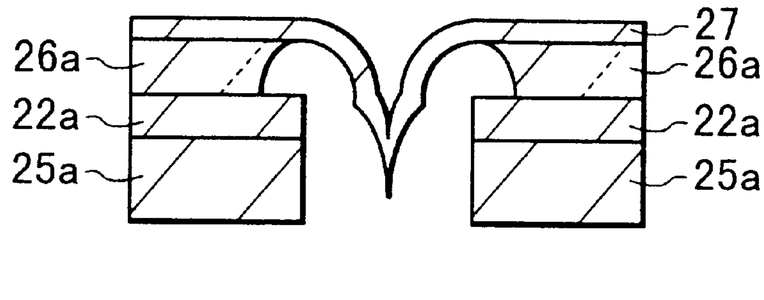

Lastly, as shown in FIG. 4F, the whole of the starting substrate 20*e* and side spacer 24*a* and part of the third sacrificial film 26 are etched and removed from the bottom side, to leave a peripheral third sacrificial film 26*a* and expose the tip of the emitter electrode 27.

With the above processes, a field emission element (two-electrode element) having the two-stage shaped emitter electrode 27 is completed. Since the getter film (Ti film) 22*a* is a conductive film formed on the gate electrode ($WSi_x$ film) 25*a*, it can function as the gate electrode together with the gate electrode 25*a*. This field emission element has the emitter electrode 27 and gate electrodes 25*a* and 22*a*. After or before field emission elements are hermetically accommodated in the flat panel display, the getter film 22*a* of field emission elements is activated by heating them or by light application.

FIGS. 5A to 5F are schematic cross sectional views illustrating the manufacture steps of a field emission element (two-electrode element) according to another modification of the first embodiment of the invention.

Figure 5A:
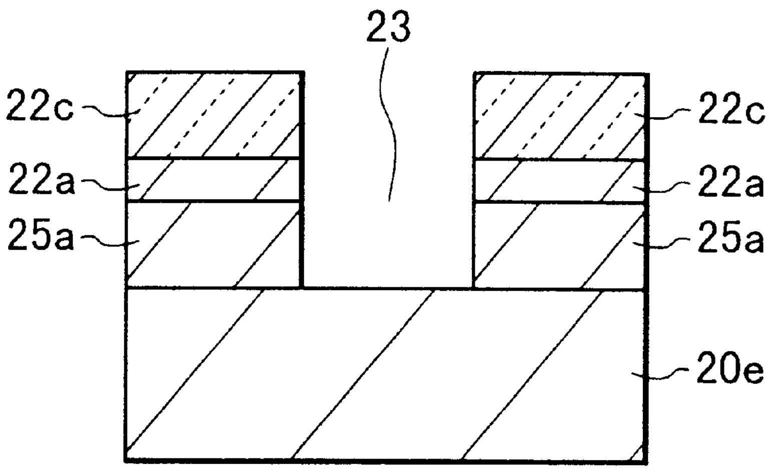
FIGS. 5A to 5F are schematic cross sectional views illustrating the manufacture steps of a field emission element (two-electrode element) according to another modification of the first embodiment of the invention.

As shown in FIG. 5A, similar to the first embodiment, by photolithography and etching, a gate electrode 25*a*, a first sacrificial film (getter film) 22*a* and a second sacrificial film (insulating film) 22*c* respectively having a predetermined pattern are formed on a starting substrate 20*e* of Si.

More specifically, on the surface of the starting substrate 20*e* of Si, a gate electrode film of $WSi_x$ is deposited to a thickness of 0.3 $\mu$m by sputtering, and on the gate electrode film a getter material layer of Ti is deposited to a thickness of 0.04 $\mu$m by sputtering, and on the getter material layer a second sacrificial film of $SiN_x$ is deposited to a thickness of 0.3 $\mu$m by reactive sputtering. Thereafter, by photolithography and etching, the gate electrode film, getter material layer and second sacrificial film are patterned. This patterning process forms a hole 23 through the second sacrificial film to . the surface of the starting substrate 20*e*. A hole formed through the gate electrode film corresponds to the gate hole. This patterning process therefore forms the gate electrode 25*a* having the gate hole, and also forms the getter film 22*a* and second sacrificial film 22*c* shown in FIG. 5A. The getter film 22*a* is formed between the gate electrode 25*a* and second sacrificial film 22*c*.

If the thickness of $SiN_x$ is set to 0.3 $\mu$m, the antireflection effect can be obtained. A resolution of photolithography and an etching precision are therefore improved.

Sputtering for the getter material layer (Ti film) is performed in a DC sputtering system by using Ti as a target while Ar gas is introduced. Reactive sputtering for the second sacrificial film ($SiN_x$ film) is performed in a DC sputtering system by using Si as a target while $N_2$+Ar gas is introduced. The second sacrificial film ($SiN_x$ film) may be deposited by plasma CVD or low pressure CVD.

Figure 5B:
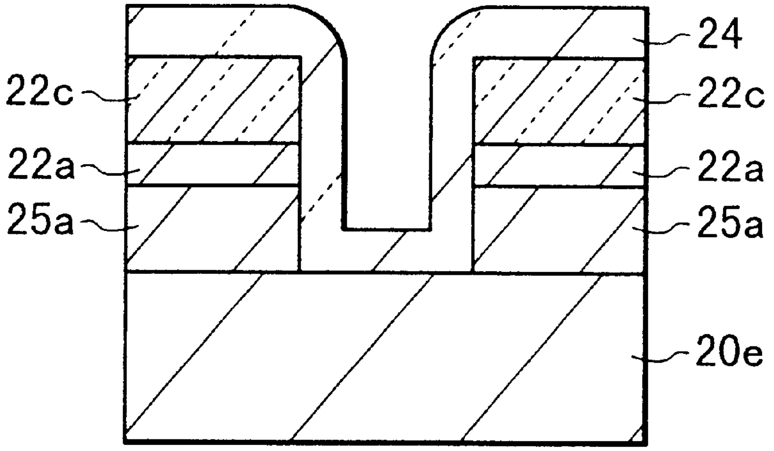

Next, as shown in FIG. 5B, a third sacrificial film (insulating film) 24 of $SiO_2$ is isotropically deposited over the whole upper surface of the substrate to a thickness of 0.15 $\mu$m by atmospheric pressure CVD.

Figure 5C:
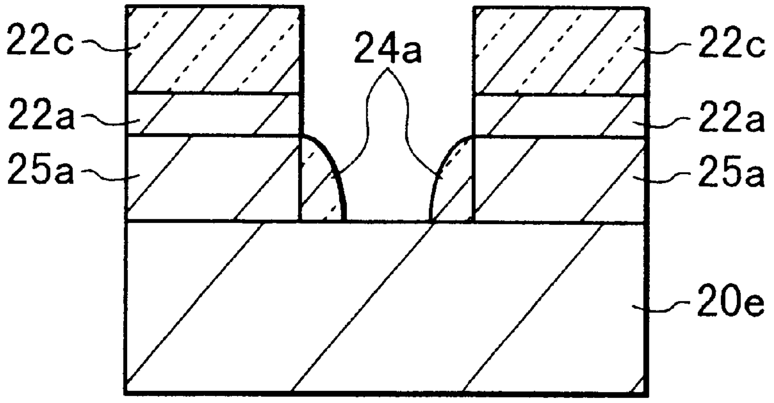

Next, as shown in FIG. 5C, the third sacrificial film 24 is anisotropically dry-etched to leave a third sacrificial film 24*a* as a side spacer only on the side wall of the gate electrode 25*a* and/or the side wall of the getter film 22*a*. This etching process exposes the side wall of the getter film 22*a* and the side wall of the getter film 22*a* and a partial surface of the starting substrate 20*e*.

For example, this etching is performed in a magnetron RIE system by using $CHF_3+CO_2+Ar$ as etching gas under the conditions of a reaction chamber pressure of 50 mTorr (about $50\times10^{-3}\times133.3$ Pa), a $CHF_3/CO_2/Ar$ flow ratio of 60/10/30 (sccm), a substrate cooling He pressure of 8 Torr (about 8×133.3 Pa), a magnetic field of 30 G, and an RF power of 700 W.

Figure 5D:
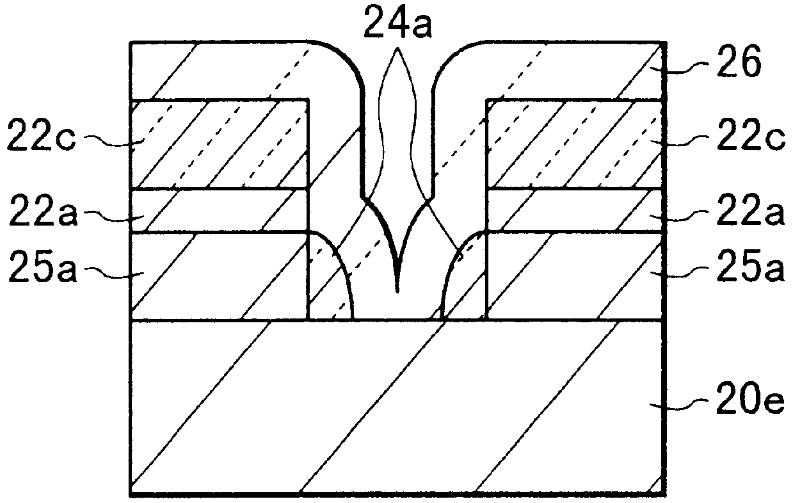

Next, as shown in FIG. 5D, a fourth sacrificial film (insulating film) 26 of $SiO_2$ is isotropically deposited over the whole upper surface of the substrate to a thickness of 0.15 $\mu$m by atmospheric pressure CVD. The fourth sacrificial film 26 is deposited on the surfaces of the starting substrate 20*e*, side spacer 24*a*, getter film 22*a*, and second sacrificial film 22*c*, being conformal to the surface topology. The surface topology of the third sacrificial film 26 has curves of two stages. This surface of the fourth sacrificial film 26 is used as a mold for forming a two-stage shaped emitter electrode.

Figure 5E:
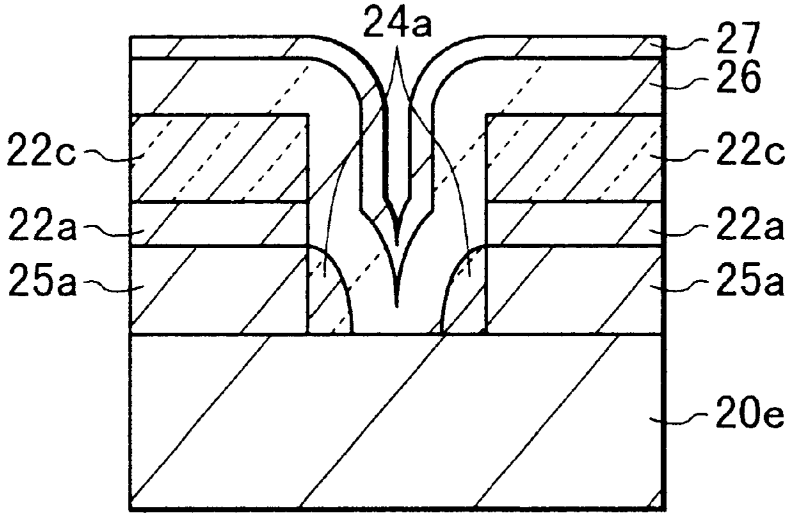

Next, as shown in FIG. 5E, an emitter electrode 27 of, for example, $TiN_x$, is deposited on the fourth sacrificial film 26 to a thickness of about 0.05 $\mu$m by reactive sputtering.

Figure 5F:
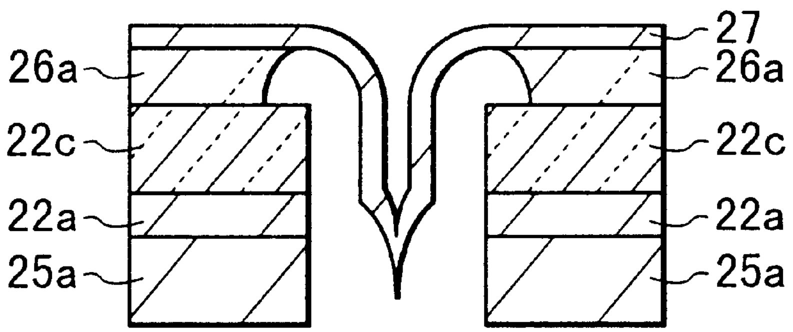

Lastly, as shown in FIG. 5F, the whole of the starting substrate 20*e* and side spacer 24*a* and part of the fourth sacrificial film 26 are etched and removed from the bottom side, to leave a peripheral fourth sacrificial film 26*a* and expose the tip of the emitter electrode 27.

With the above processes, a field emission element (two-electrode element) having the two-stage shaped emitter electrode 27 is completed. Since the getter film (Ti film) 22*a* is a conductive film formed on the gate electrode 25*a*, it can function as the gate electrode together with the gate electrode 25*a*. This field emission element has the emitter electrode 27 and gate electrodes 25*a* and 22*a*. After or before field emission elements are hermetically accommodated in the flat panel display, the getter film 22*a* of field emission elements is activated by heating them or by light application.

FIGS. 6A to 6F are schematic cross sectional views illustrating the manufacture steps of a field emission element (two-electrode element) according to another modification of the first embodiment of the invention.

Figure 6A:
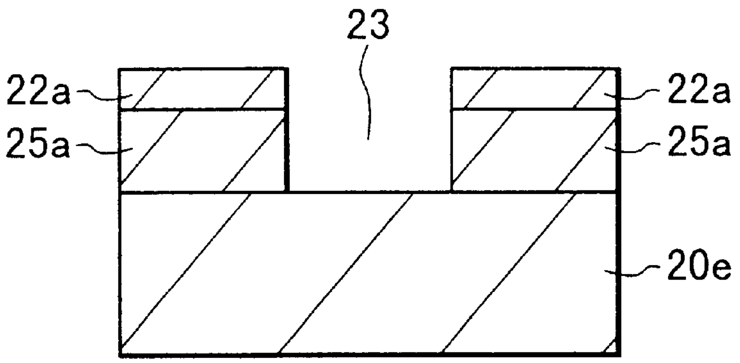
FIGS. 6A to 6F are schematic cross sectional views illustrating the manufacture steps of a field emission element (two-electrode element) according to another modification of the first embodiment of the invention.

As shown in FIG. 6A, similar to the first embodiment, by photolithography and etching, a gate electrode 25*a* and a first sacrificial film (getter film) 22*a* respectively having a predetermined pattern are formed on a starting substrate 20*e* of Si.

More specifically, on the surface of the starting substrate 20*e* of Si, a gate electrode film is deposited by CVD to a thickness of 0.15 μm, the gate electrode film being made of polysilicon doped with P (phosphorous) or B (boron). On the gate electrode film, a getter material layer of Ti is deposited by sputtering to a thickness of 0.04 μm. Thereafter, by photolithography and etching, the gate electrode film and getter material layer are patterned. This patterning process forms a hole 23 through the getter material layer, the hole 23 reaching the surface of the starting substrate 20*e*. A hole formed through the gate electrode film corresponds to the gate hole. Namely, this patterning process forms the gate electrode 25*a* having the gate hole and the getter film 22*a* shown in FIG. 6A.

Figure 6B:
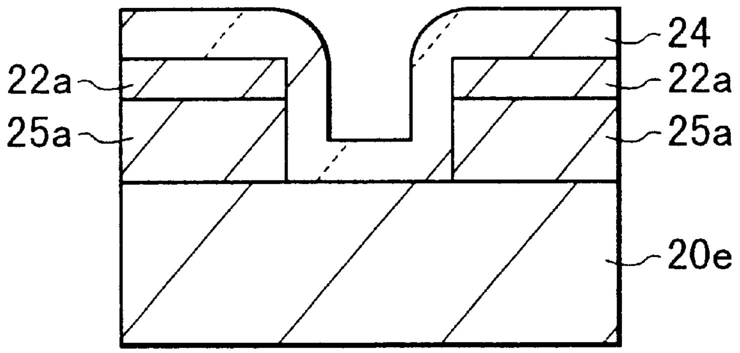

Next, as shown in FIG. 6B, a second sacrificial film (insulating film) 24 of $SiO_2$ is isotropically deposited over the whole upper surface of the substrate to a thickness of 0.15 μm by atmospheric pressure CVD.

Figure 6C:
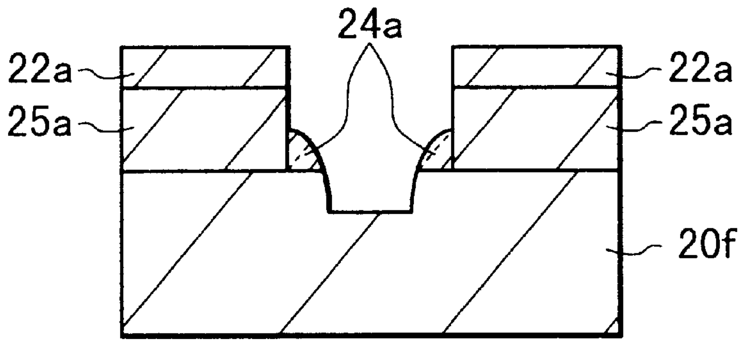

Next, as shown in FIG. 6C, the second sacrificial film 24 is anisotropically dry-etched to leave a second sacrificial film 24*a* as a side spacer only on the side wall of the gate electrode 25*a*. This etching process exposes the side walls of the getter film 22*a* and gate electrode 25*a*, and stops when the substrate 20*f* is trenched 0.1 μm deep. This etching process forms the substrate 20*f* having a recess. For example, this etching is performed in a magnetron RIE system by using $CHF_3$+$CO_2$+Ar as etching gas under the conditions of a reaction chamber pressure of 50 mTorr (about $50\times10^{-3}\times133.3$ Pa), a $CHF_3/CO_2$/Ar flow ratio of 60/10/30 (sccm), a substrate cooling He pressure of 8 Torr (about 8×133.3 Pa), a magnetic field of 30 G, and an RF power of 700 W.

Figure 6D:
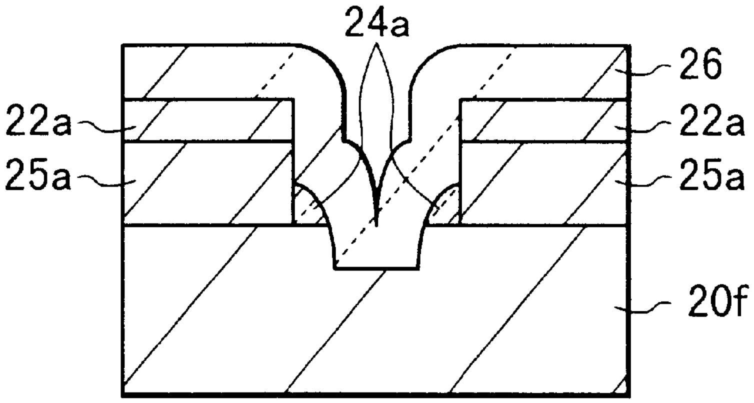

Next, as shown in FIG. 6D, a third sacrificial film (insulating film) 26 of $SiO_2$ is isotropically deposited over the whole upper surface of the substrate to a thickness of 0.15 μm by atmospheric pressure CVD. The third sacrificial film 26 is deposited on the surfaces of the substrate 20*f*, side spacer 24*a*, gate electrode 25*a*, and getter film 22*a*, being conformal to the surface topology. The surface topology of the third sacrificial film 26 has curves of two stages. This surface of the third sacrificial film 26 is used as a mold for forming a two-stage shaped emitter electrode.

Figure 6E:
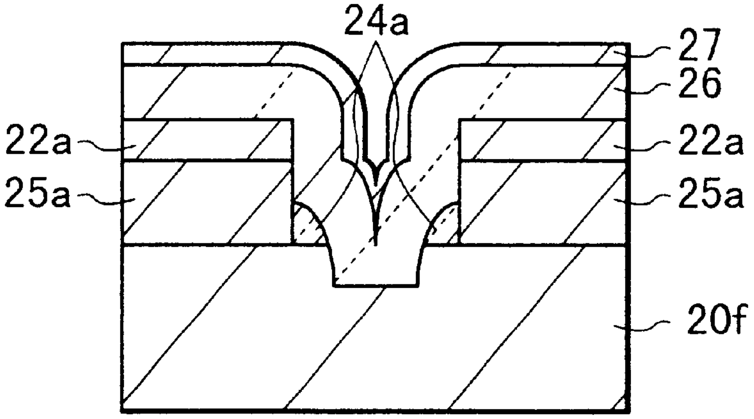

Next, as shown in FIG. 6E, an emitter electrode 27 of, for example, $TiN_x$, is deposited on the third sacrificial film 26 to a thickness of about 0.05 μm by reactive sputtering.

Figure 6F:
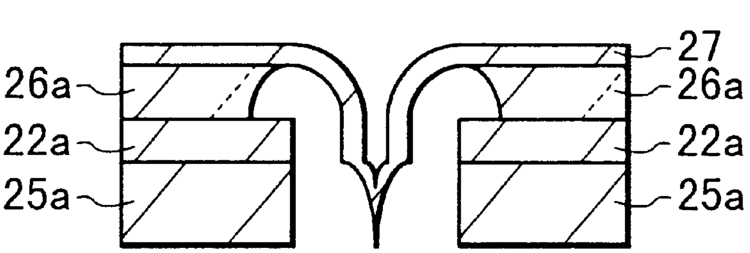

Lastly, as shown in FIG. 6F, the whole of the starting substrate 20*f* and side spacer 24*a* and part of the third sacrificial film 26 are etched and removed from the bottom side, to leave a peripheral third sacrificial film 26*a* and expose the tip of the emitter electrode 27.

This two-electrode element has the emitter electrode 27 positioned lower (as viewed in FIG. 6F) relative to the gate electrode 25*a* than the two-electrode element shown in FIG. 4F, because the recess is formed in the substrate 20*f* at the etching process shown in FIG. 6C.

With the above processes, a field emission element (two-electrode element) having the two-stage shaped emitter electrode 27 is completed. Since the getter film (Ti film) 22*a* is a conductive film, it can function as the gate electrode. This field emission element has the emitter electrode 27 and gate electrodes 25*a* and 22*a* and can be used with a flat display panel. After or before field emission elements are hermetically accommodated in the flat panel display, the getter film 22*a* of field emission elements is activated by heating them or by light application.

FIGS. 7A to 7F are schematic cross sectional views illustrating the manufacture steps of a field emission element (two-electrode element) according to another modification of the first embodiment of the invention.

Figures 7A, 7B, 7C:
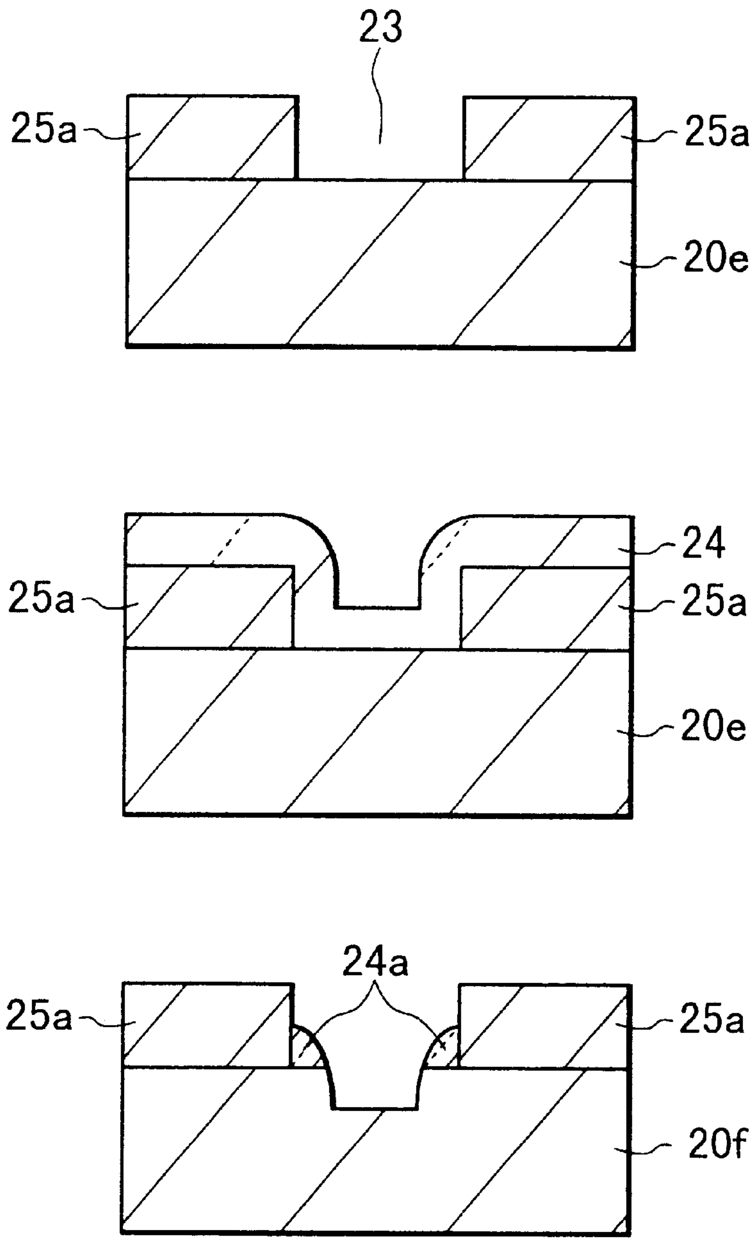
FIGS. 7A to 7F are schematic cross sectional views illustrating the manufacture steps of a field emission element (two-electrode element) according to another modification of the first embodiment of the invention.

As shown in FIG. 7A, similar to the first embodiment, by photolithography and etching, a gate electrode/getter film 25*a* having a predetermined pattern is formed on a starting substrate 20*e* of Si.

More specifically, on the surface of the starting substrate 20*e* of Si, a gate electrode film/getter material layer is deposited by sputtering to a thickness of 0.3 μm. Thereafter, by photolithography and etching, the gate electrode film/getter material layer is patterned. This patterning process forms a hole 23 through the gate electrode film/getter material layer, the hole 23 reaching the surface of the starting substrate 20*e*. The hole formed through the gate electrode film/getter material layer corresponds to the gate hole. Namely, this patterning process forms the gate electrode/getter film 25*a* having the gate hole shown in FIG. 7A.

Next, as shown in FIG. 7B, a second sacrificial film (insulating film) 24 of $SiO_2$ is isotropically deposited over the whole upper surface of the substrate to a thickness of 0.15 μm by atmospheric pressure CVD.

Next, as shown in FIG. 7C, the second sacrificial film 24 is anisotropically dry-etched to leave a second sacrificial film 24*a* as a side spacer only on the side wall of the gate electrode/getter film 25*a*. This etching process exposes the upper area of the side wall of the gate electrode/getter film 25*a*, and stops when the substrate 20*f* is trenched 0.1 μm deep. This etching process forms the substrate 20*f* having a recess. For example, this etching is performed in a magnetron RIE system by using $CHF_3$+$CO_2$+Ar as etching gas under the conditions of a reaction chamber pressure of 50 mTorr (about $50\times10^{-3}\times133.3$ Pa), a $CHF_3CO_2$/Ar flow ratio of 60/10/30 (sccm), a substrate cooling He pressure of 8 Torr (about 8×133.3 Pa), a magnetic field of 30 G, and an RF power of 700 W.

Figure 7D:
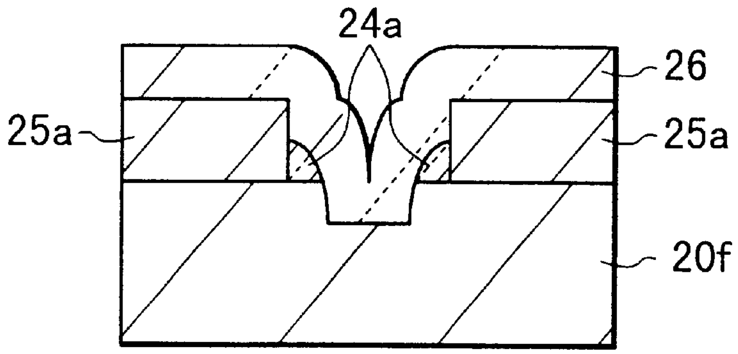

Next, as shown in FIG. 7D, a third sacrificial film (insulating film) 26 of $SiO_2$ is isotrbpically deposited over the whole upper surface of the substrate to a thickness of 0.15 μm by atmospheric pressure CVD. The third sacrificial film 26 is deposited on the surfaces of the substrate 20*f*, side spacer 24*a*, gate electrode/getter film 25*a*, being conformal to the surface topology. The surface topology of the third sacrificial film 26 has curves of two stages. This surface of the third sacrificial film 26 is used as a mold for forming a two-stage shaped emitter electrode.

Figure 7E:
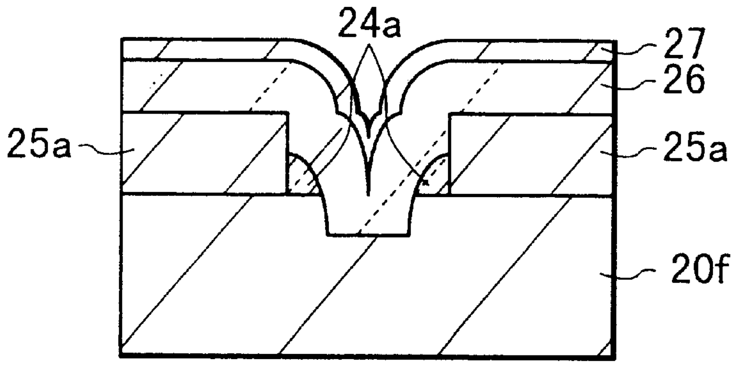

Next, as shown in FIG. 7E, an emitter electrode 27 of, for example, $TiN_x$, is deposited on the third sacrificial film 26 to a thickness of about 0.05 μm by reactive sputtering.

Figure 7F:
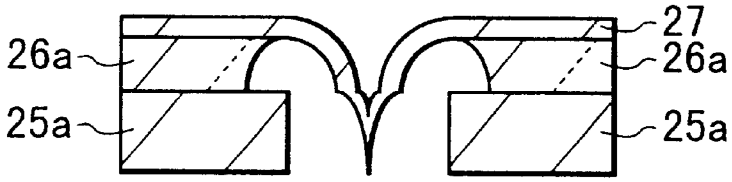

Lastly, as shown in FIG. 7F, the whole of the starting substrate 20*f* and side spacer 24*a* and part of the third sacrificial film 26 are etched and removed from the bottom side, to leave a peripheral third sacrificial film 26*a* and expose the tip of the emitter electrode 27.

With the above processes, a field emission element (two-electrode element) having the two-stage shaped emitter electrode 27 is completed. The gate electrode/getter film (Ti film) 25*a* functions as the gate electrode and getter film. This field emission element has the emitter electrode 27 and gate electrode 25*a* and can be used with a flat display panel. After or before field emission elements are hermetically accommodated in the flat panel display, the getter film 25*a* of field emission elements is activated by heating them or by light application.

The manufacture steps of a field emission element (two-electrode element) having an emitter electrode and a gate electrode have been described above. In the following, the manufacture steps of a three-electrode element as an example of another field emission element will be described.

FIGS. 8A to 8L are schematic cross sectional views illustrating the manufacture steps of a field emission element (three-electrode element) according to the second embodiment of the invention. A three-electrode element has an emitter electrode, a gate electrode and an anode electrode.

Figure 8A:
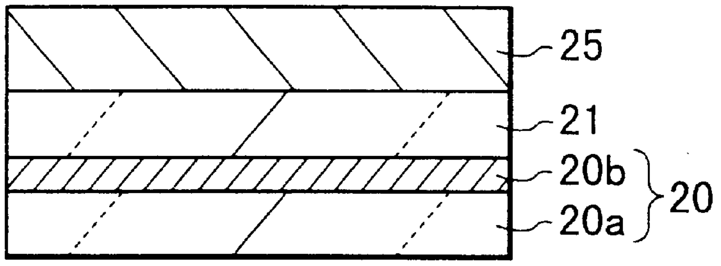
FIGS. 8A to 8L are schematic cross sectional views illustrating the manufacture steps of a field emission element (three-electrode element) according to a second embodiment of the invention.

As shown in FIG. 8A, a substrate 20 is made of a starting substrate 20*a* and an anode electrode film 20*b* formed thereon. On the surface of the starting substrate 20*a* made of $SiO_2$ or the like, the anode electrode film 20*b* of $WSi_x$ is deposited to a thickness of 0.05 μm by sputtering. Sputtering for the anode electrode film ($WSi_x$ film) 20*b* is performed in a DC sputtering system by using $WSi_x$ as a target while Ar gas is introduced.

Next, a first sacrificial film (insulating film) 21 of $SiO_2$ is deposited on the anode electrode film 20*b* by CVD, and on the first sacrificial film a gate electrode film of $WSi_x$ is deposited to a thickness of 0.3 μm by sputtering similar to the above.

Figure 8B:
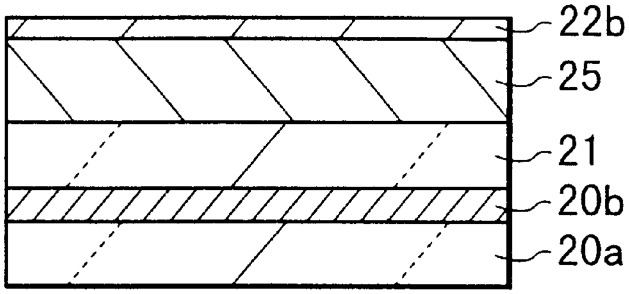

Next, as shown in FIG. 8B, a second sacrificial film (getter material layer) 22*b* of Ti is deposited on the gate electrode film 25 to a thickness of 0.04 μm by sputtering. Sputtering for the getter material layer (Ti film) 22*b* is performed in a DC sputtering system by using Ti as a target while Ar gas is introduced. In place of Ti, the getter material layer 22*b* may be formed by using Ta or Zr (zirconium).

Figure 8C:
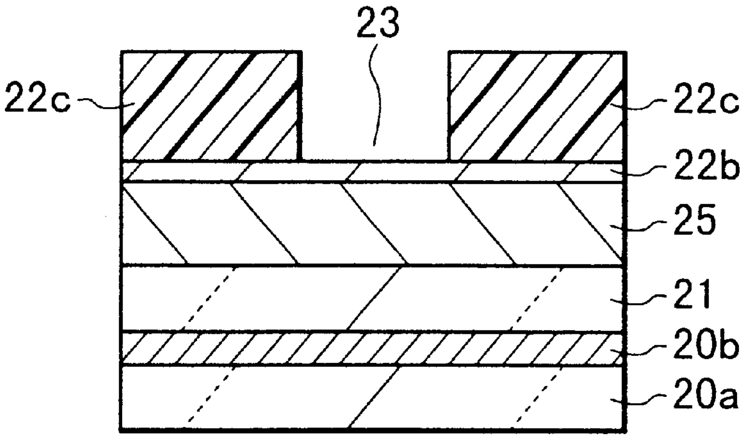

Next as shown in FIG. 8C, a resist film 22*c* having a predetermined pattern with a hole 23 is formed on the getter material layer through photolithography.

Figure 8D:
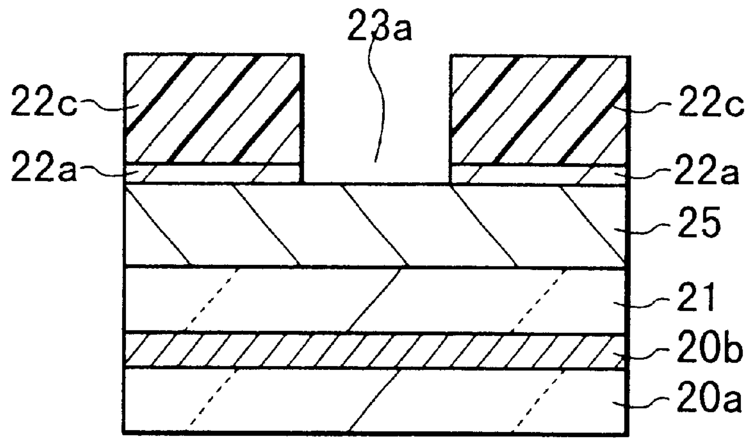

Next, as shown in FIG. 8D, by using the resist film 22*c* as a mask, the getter material layer 22*b* is anisotropically etched to leave a getter film 22*a* having a predetermined pattern with a hole 23*a*. This hole 23*a* has a generally vertical side wall and has a circular plan shape (as viewed from the top) having a diameter of 0.5 μm.

Figure 8E:
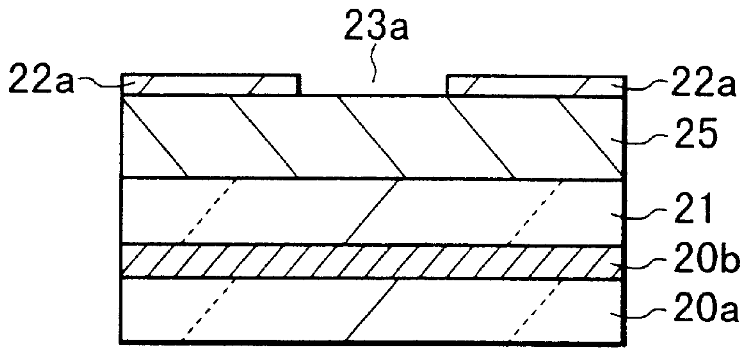

Next, as shown in FIG. 8E, the resist pattern 22*c* is removed to expose the upper surface of the getter film 22*a*.

Figure 8F:
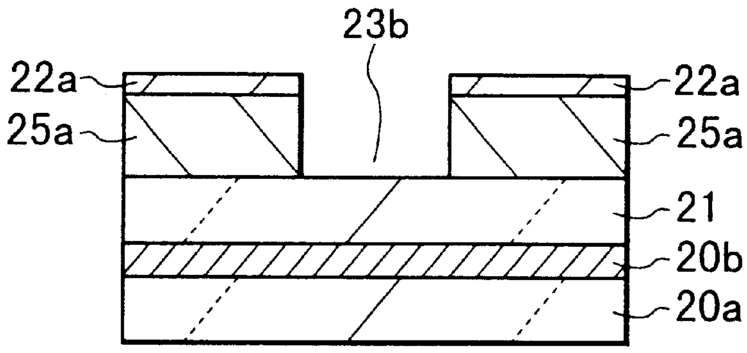

Next, as shown in FIG. 8F, by using the getter film 22*a* as a mask, the gate electrode film 25 is anisotropically etched to form a gate electrode 25*a* having a predetermined pattern with a hole (gate hole) 23*b*.

When the gate electrode film 25 is etched, the resist film 22*c* and getter film 22*a* may be used as the mask, by leaving the resist film 23*c* on the getter film 22*a*. In this case, the resist film 22*c* is removed thereafter.

Figure 8G:
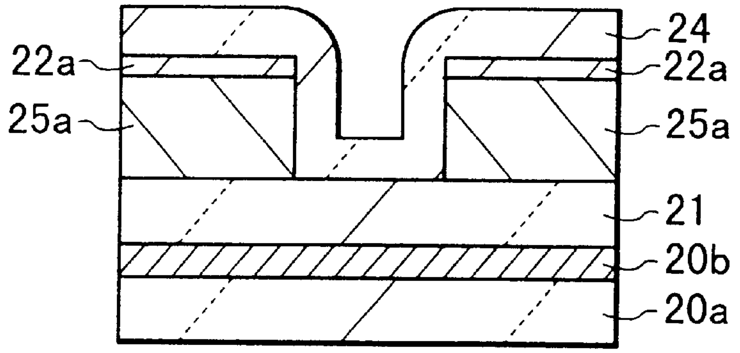

Next, as shown in FIG. 8G, a third sacrificial film (insulating film) 24 of $SiO_2$ is deposited over the whole upper surface of the substrate to a thickness of 0.15 μm by atmospheric pressure CVD. For example, the atmospheric pressure CVD is performed by using $O_3$ and TEOS as source gas at a substrate temperature of 400° C.

Figure 8H:
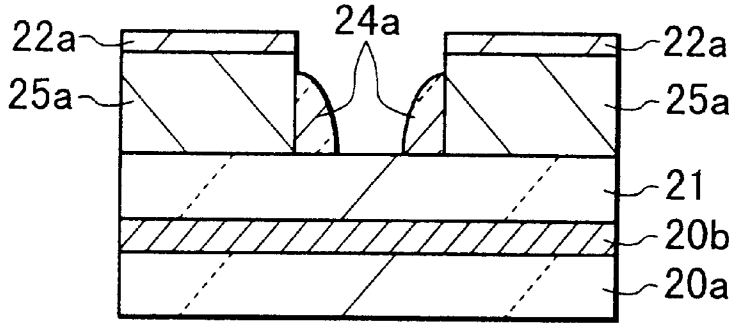

Next, as shown in FIG. 8H, the third sacrificial film 24 is anisotropically dry-etched (etched back) to leave a third sacrificial film 24*a* as a side spacer only on the side wall of the gate electrode 25*a* and/or the side wall of the getter film 22*a*. This etching exposes the upper area of the side wall of the getter film 22*a* and a partial surface area of the first sacrificial film 21.

For example, this etching is performed in a magnetron RIE system by using $CHF_3$+$CO_2$+Ar as etching gas under the conditions of a reaction chamber pressure of 50 mTorr (about $50\times10^{-3}\times133.3$ Pa), a substrate cooling He pressure of 8 Torr (about 8×133.3 Pa), a magnetic field of 30 G, and an RF power of 700 W.

Figure 8I:
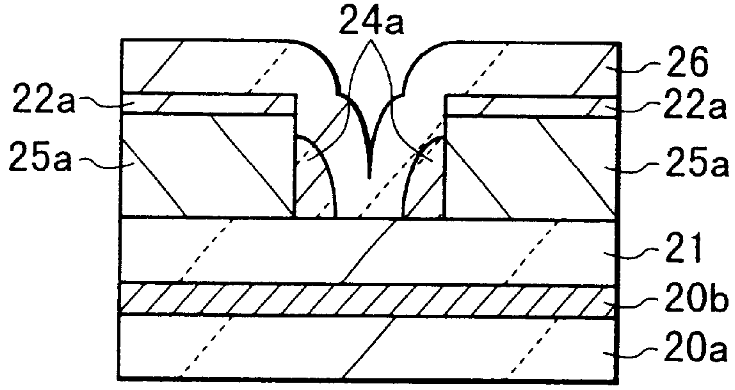

Next, as shown in FIG. 8I, a fourth sacrificial film (insulating film) 26 of $SiO_2$ is isotropically deposited over the whole upper surface of the substrate to a thickness of 0.15 μm by atmospheric pressure CVD. The fourth sacrificial film 26 is deposited on the surfaces of the first sacrificial film 21, side spacer 24*a* and getter film 22*a*, being conformal to the surface topology. The surface topology of the fourth sacrificial film 26 has curves of two stages. This surface of the fourth sacrificial film 26 is used as a mold for forming a two-stage shaped emitter electrode.

Figure 8J:
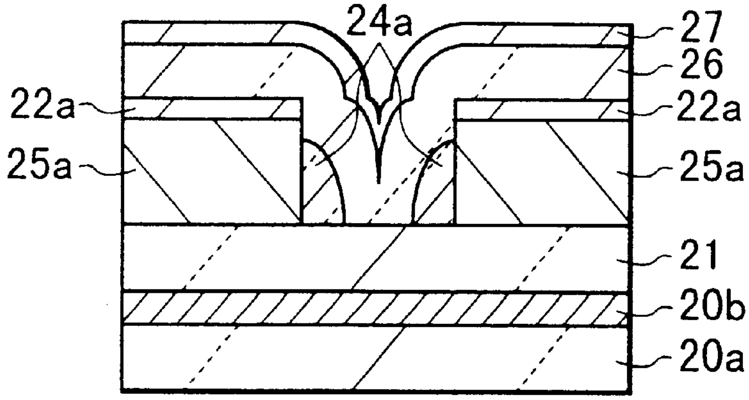

Next, as shown in FIG. 8J, an emitter electrode 27 of, for example, $TiN_x$, is deposited on the fourth sacrificial film 26 to a thickness of about 0.05μm by reactive sputtering. This reactive sputtering is performed in a DC sputtering system by using Ti as a target while gas of $N_2$+Ar is introduced.

Figure 8K:
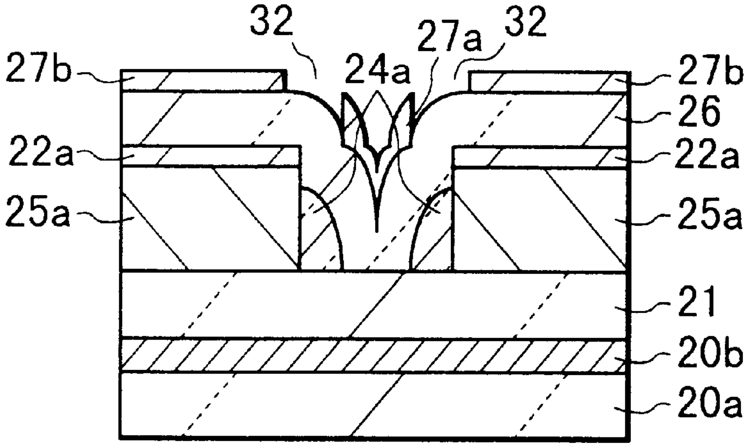

Next, a resist film (not shown) having a predetermined pattern is formed on the emitter electrode 27 by photolithography. As shown in FIG. 8K, by using this resist film as an etching mask, slit openings 32 are formed by RIE through the emitter electrode 27*a* on both sides thereof in areas where the emitter electrode 27*a* is not used as the cathode. An emitter electrode 27*b* shown in FIG. 8K is an emitter electrode formed outside of the slit openings 32. For example, RIE is performed in a magnetron RIE system by using $Cl_2$ as etching gas at a reaction chamber pressure of 125 mTorr (about $125\times10^{-3}\times133.3$ Pa).

Figure 8L:
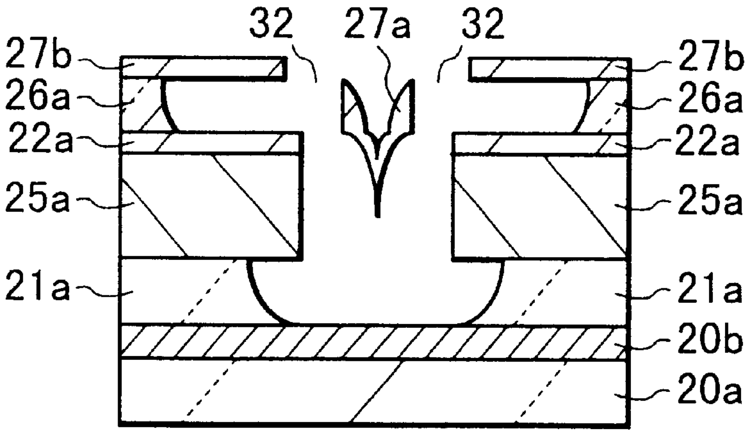

Next, as shown in FIG. 8L, part of the fourth sacrificial film 26, the whole of the side spacer 24*a*, and part of the first sacrificial film 21 are isotropically wet etched and removed through the slit openings 32 to leave a peripheral fourth sacrificial film 26*a* and first sacrificial film 21*a*.

This etching exposes the emitter electrode 27*a*, gate electrode 25*a* and anode electrode film 20*b*. Since the getter film 22*a* electrically connects the gate electrode 25*a*, a resistance of the gate wiring line can be lowered.

Figure 9:
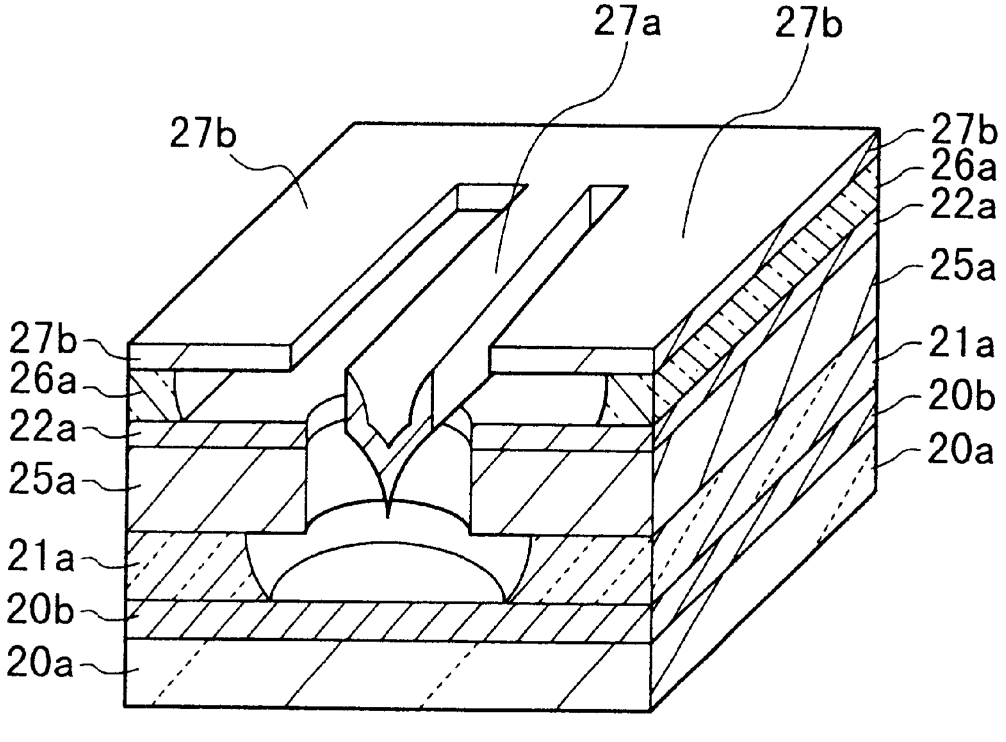
FIG. 9 is a schematic perspective view of the field emission element shown in FIG. 8L.

FIG. 9 is a schematic perspective view partially in section of the three-electrode element shown in FIG. 8L. The emitter electrode 27*a* is continuous with the emitter electrode 27*b* and supported by the latter. The gate electrode 25*a* and getter film 22*a* have circular holes (gate holes) near at the tip of the emitter electrode 27*a*. The getter film 22*a* surrounds the tip of the emitter electrode 27*a*. The tip of the emitter electrode 27*a* has a needle-like sharp edge near the gate hole of the gate electrode 25*a*.

The three-electrode element has the emitter electrode 27*a* as a cathode and an anode electrode film 20*b* as an anode. As a positive potential is applied to the gate electrode 25*a*, electrons can be emitted from the emitter electrode 27*a* toward the anode electrode film 20*b*.

Also in the case of the three-electrode element, by forming the getter film 22*a* near the tip of the emitter electrode 27*a*, the vacuum degree in the space near the emitter electrode 27*a* can be raised.

Figure 10A:
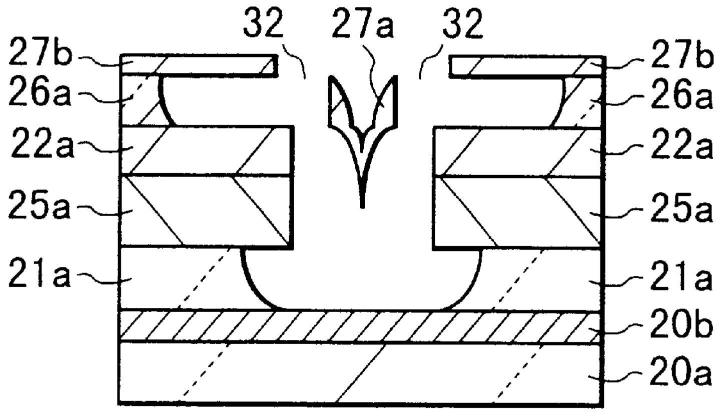
FIGS. 10A to 10D are schematic cross sectional views illustrating the manufacture steps of a field emission element (three-electrode element) according to modification of the second embodiment of the invention.

FIG. 10A is a schematic cross sectional view showing another example of the three-electrode element. This three-electrode element is fundamentally the same as the three-electrode element (shown in FIG. 8L), excepting that the gate electrode 25*a* is made of a $WSi_x$ film having a thickness of 0.3 μm and the getter film 22*a* is made of a Ti film having a thickness of 0.2 μm. The other structures are the same.

Figure 10B:
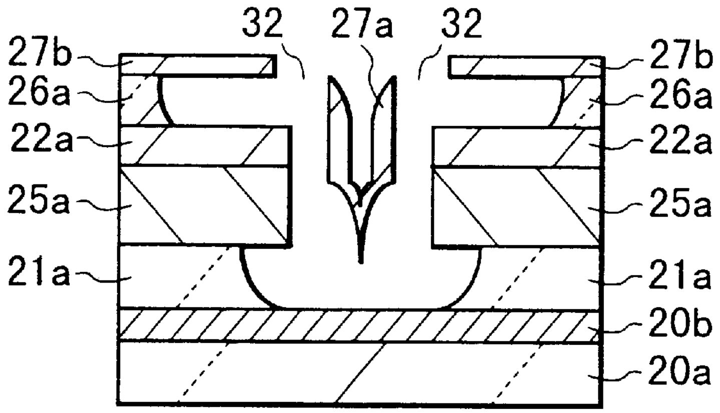

FIG. 10B is a schematic cross sectional view showing another example of the three-electrode element. This three-electrode element is fundamentally the same as the three-electrode element (shown in FIG. 8L), excepting that the gate electrode 25*a* is made of a $WSi_x$ film having a thickness of 0.3 μm and the getter film 22*a* is made of a Ta film having a thickness of 0.15 μm. Another different point is that in the etching process shown in FIG. 8H, an over-etch is performed to form a recess having a depth of 0.1 μm in the first sacrificial film 21. The emitter electrode 27*a* can therefore be lowered relative to the gate electrode 25*a* as viewed in FIG. 8H. The other structures are the same. For example, this over-etch is performed in a magnetron RIE system by using $CHF_3$+$CO_2$+Ar as etching gas under the conditions of a reaction chamber pressure of 50 mTorr (about $50\times10^{-3}\times$ 133.3 Pa), a $CHF_3/CO_2$/Ar flow ratio of 60/10/30 (sccm), a substrate cooling He pressure of 8 Torr (about 8×133.3 Pa), a magnetic field of 30 G, and an RF power of 700 W.

Figure 10C:
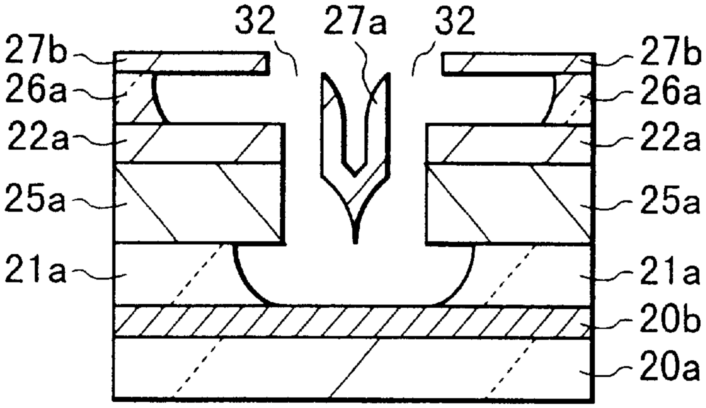

FIG. 10C is a schematic cross sectional view showing another example of the three-electrode element. This three-electrode element is fundamentally the same as the three-electrode element (shown in FIG. 8L), excepting that the getter film 22*a* is made of a Ti film and that in the etching process shown in FIG. 8H, an over-etch is performed to form a recess having a depth of 0.1 μm in the first sacrificial film 21. The other structures are the same. For example, this over-etch is performed in a magnetron RIE system by using $CHF_3$+$CO_2$+Ar as etching gas under the conditions of a reaction chamber pressure of 50 mTorr (about $50\times10^{-3}\times$ 133.3 Pa), a $CHF_3/CO_2$/Ar flow ratio of 60/10/30 (sccm), a substrate cooling He pressure of 8 Torr (about 8×133.3 Pa), a magnetic field of 30 G, and an RF power of 700 W.

Figure 10D:
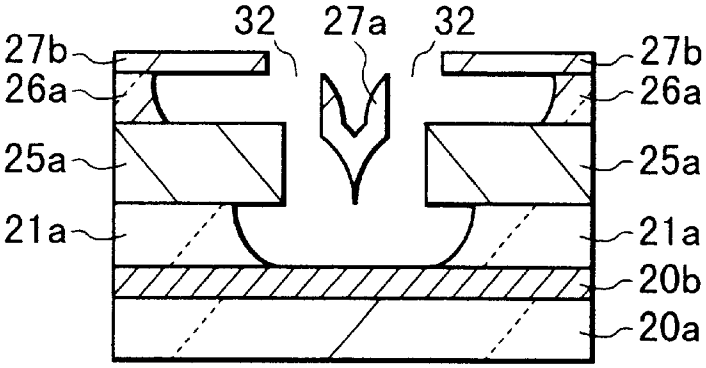

FIG. 10D is a schematic cross sectional view showing another example of the three-electrode element. This three-electrode element is fundamentally the same as the three-electrode element (shown in FIG. 8L), excepting that the two layers of the gate electrode and getter film are made of one layer of a gate electrode/getter film 25*a* of Ti or the like and that in the etching process shown in FIG. 8H, an over-etch is performed to form a recess having a depth of 0.1 μm in the first sacrificial film 21. The other structures are the same. For example, this over-etch is performed in a magnetron RIE system by using $CHF_3$+$CO_2$+Ar as etching gas under the conditions of a reaction chamber pressure of 50 mTorr (about $50\times10^{-3}\times133.3$ Pa), a $CHF_3/CO_2$/Ar flow ratio of 60/10/30 (sccm), a substrate cooling He pressure of 8 Torr (about 8×133.3 Pa), a magnetic field of 30 G, and an RF power of 700 W.

In the first and second embodiments, the getter film in a field emission element is formed under or on the gate electrode or by making the gate electrode of getter material. Since the getter film is formed surrounding the tip of the emitter electrode, molecules near the emitter electrode can be adsorbed and the vacuum degree can be raised.

By raising the vacuum degree near the emitter electrode, radiation current from the emitter electrode can be prevented from being lowered, a magnitude of the radiation current can be prevented from fluctuating, and the emitter electrode can be prevented from being deformed through sputtering.

Furthermore, the uniformity and reproductivity of characteristics of field emission elements in each flat display panel and between flat display panels can be improved and flicker to be caused by luminance differences of a flat display panel can be reduced.

Still further, since the getter film is provided in a field emission element, the size of a flat panel display can be made smaller than when the getter material is provided outside of field emission elements. It is not limited only to that the getter film is formed directly on the gate electrode, but an insulating film or other film may be formed between the gate electrode and getter film.

A side spacer made of Ti, Ta or Zr can be used as a getter film.

For the elements shown in FIGS. 2F, 4F, and 6F, the gate electrode may be heated by light application to heat and activate the getter film through heat conduction. For the elements shown in FIGS. 8L and 10D, the emitter electrode may be heated by light application to heat and activate the getter film through heat conduction.

The material of the gate electrode and emitter electrode may be semiconductor such as polysilicon and amorphous silicon, silicide such as $SWi_x$, $TiSi_x$ and $MoSi_x$, metal such as Al, Cu, W, Mo and Ni, and conductive nitride such as $TiN_x$.

FIGS. 11A to 11I are schematic cross sectional views illustrating the manufacture steps of a field emission element according to the third embodiment of the invention.

Figure 11A:
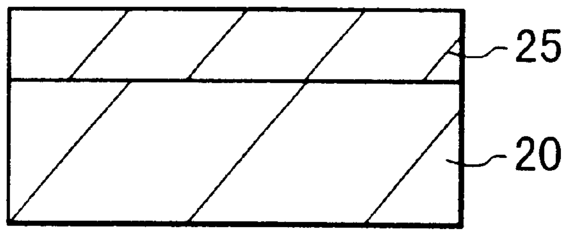
FIGS. 11A to 11I are schematic cross sectional views illustrating the manufacture steps of a field emission element according to a third embodiment of the invention.

As shown in FIG. 11A on a substrate 20 of Si or the like, a gate electrode film 25 of 0.2 μm in thickness is formed by CVD or the like. The gate electrode film 25 is, for example, a polysilicon film doped with phosphorous or boron. For example, a polysilicon film is formed by CVD by flowing $SiH_4$ gas diluted with He at a flow rate of 0.6 slm under the conditions of a chamber temperature of 625° C. and a pressure of about 225 mTorr (30 Pa). Next, in order to lower the resistance of the gate electrode film 25, phosphorous is diffused into the polysilicon film in a vertical diffusion furnace under the conditions of $POCl_3$ at 50 mg/min, $N_2$ at 20 slm, $O_2$ at 0.1 slm, and a temperature of 850° C.

It is preferable to form a silicon oxide film or silicon nitride film between the Si substrate 20 and gate electrode film 25 as an etching stopper when the Si substrate 20 is etched.

Figure 11B:
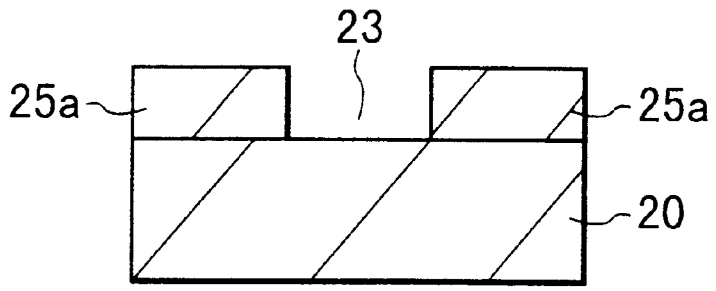

Next, as shown in FIG. 11B, by using a resist pattern (not shown) as a mask, the gate electrode film 25 is etched to form a gate electrode 25*a* with a hole (gate hole) 23. The hole (gate hole) is cylindrical and has a diameter of about 0.5 μm and a depth of about 0.2 μm. Thereafter, the resist pattern is removed.

Figure 11C:
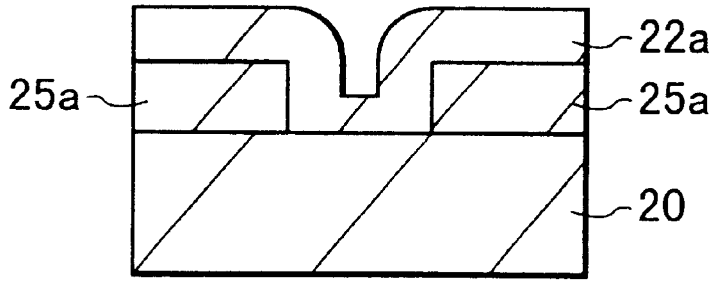

Next, as shown in FIG. 11C, a getter material layer 22*a* of Ti is isotropically formed over the whole upper surface of the substrate by sputtering. The getter material layer 22*a* has a thickness of about 0.15 μm. Sputtering is performed in a DC sputtering system by using Ti as a target while Ar gas is introduced. In order to improve the step coverage of the getter material layer 22*a*, it is preferable to form the getter material layer 22*a* by long throw sputtering, ionic beam sputtering, CVD, or plating. The getter material layer 22*a* also functions as a second gate electrode film.

Figure 11D:
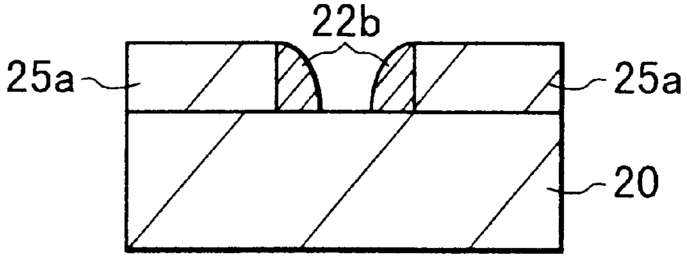
Figure 11E:
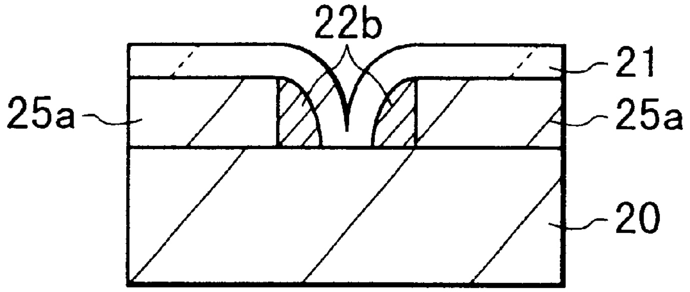

Next, the getter material layer 22*a* is anisotropically etched (etched back). As shown in FIG. 11D, this etch-back process forms a getter film 22*b* only on the side wall of the gate electrode 25*a*. The getter film 22*b* also functions as a side spacer. The etch-back process is performed by anisotropic dry-etching. For example, it is performed in a magnetron RIE system by using $Cl_2$ as etching gas at a reaction chamber pressure of 125 mTorr (about $125\times10^{-3}\times133.3$ Pa).

Next, as shown in FIG. 1E, a first sacrificial film (insulating film) 21 of a silicon oxide film is deposited over the whole upper surface of the substrate by atmospheric pressure CVD. The first sacrificial film 21 has a thickness of about 0.1 μm. For example, the atmospheric pressure CVD is performed by using $O_3$ and TEOS as source gas at a substrate temperature of 400° C.

Figure 11F:
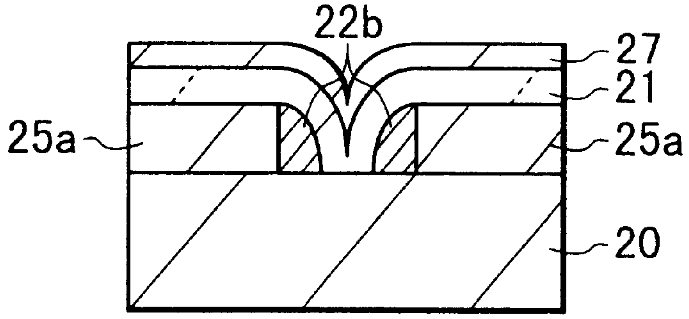

Next, as shown in FIG. 11F, a first emitter electrode 27 of $TiN_x$ is deposited on the first sacrificial film 21 by reactive sputtering. The first emitter electrode 27 has a thickness of about 0.05 μm. The reactive sputtering is performed in a DC sputtering system by using Ti as a target while $N_2$+Ar gas is introduced.

Figure 11G:
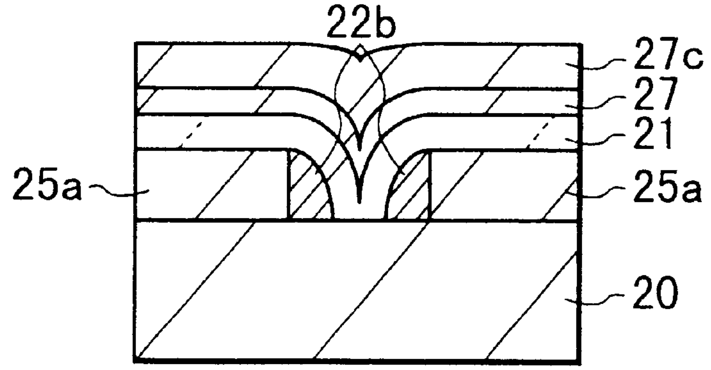

Next, as shown in FIG. 11G, a blanket film 27*c* of W (tungsten) is isotropically deposited on the first emitter electrode 27 by CVD. The blanket film 27*c* has a thickness of about 0.2 μm and functions also as a second emitter electrode. For example, CVD is performed under the conditions of source gas of $WF_6+H_2+N_2$+Ar, a pressure of 80 Torr (about 80×133.3 Pa) and a temperature of 450° C.

Figure 11H:
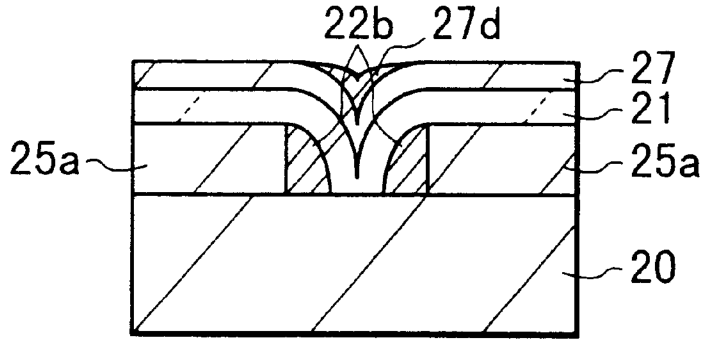

Next, as shown in FIG. 11H, the second emitter electrode 27*c* is anisotropically etched (etched back) about 0.2 μm thick to leave a second emitter electrode 27*d* only in a recess of the first emitter electrode 27. A flat surface of the first emitter electrode 27 is exposed. This etch-back is performed by anisotropic dry-etching. For example, it is performed in a magnetron RIE system by using $SF_6$+Ar+He as etching gas at a reaction chamber pressure of 280 mTorr (about $280\times10^{-3}\times133.3$ Pa).

Figure 11I:
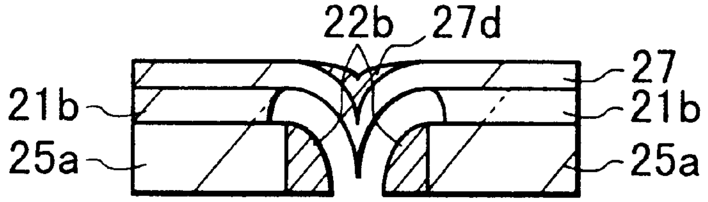

Next, as shown in FIG. 11I, the whole of the substrate 20 and part of the first sacrificial film 21 are etched and removed to leave a peripheral first sacrificial film 21*b* and expose the tip of the first emitter electrode 27. The substrate 20 made of Si is etched by using $HF+HNO_3+CH_3COOH$. The first sacrificial film 21 of a silicon oxide film is etched by $HF+NH_4F$.

With the above processes, a field emission element of a two-electrode structure having the emitter electrodes 27 and 27*d* and gate electrode 25*a* is completed. Since the getter film 22*b* of Ti is a conductive film, it functions as a gate electrode together with the gate electrode 25*a*. This field emission element has the emitter electrodes 27 and 27*d* and gate electrodes 25*a* and 22*b*. The getter film 22*b* is formed on the side wall of the gate electrode 25*a* and surrounds the tip of the first emitter electrode 27.

By heating the getter film 22 by light application or the like, the getter film 22*b* can be activated. The getter film 22*b* adsorbs ambient molecules so that the vacuum degree in the flat panel display can be improved.

FIGS. 12A to 12I are schematic cross sectional views illustrating the manufacture steps of a field emission element according to a modification of the third embodiment of the invention.

Figure 12A:
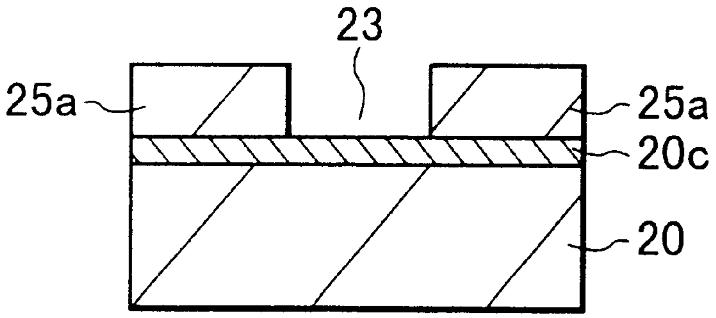
FIGS. 12A to 12I are schematic cross sectional views illustrating the manufacture steps of a field emission element according to a modification of the third embodiment of the invention.

As shown in FIG. 12A, on a substrate 20 of Si or the like, a getter material layer 20*c* is formed by sputtering. The getter material layer 20*c* has a thickness of 0.1 μm, and functions also as a first gate electrode film. The sputtering is performed in a DC sputtering system by using Ti as a target while Ar gas is introduced. It is preferable to form a silicon oxide film or silicon nitride film between the substrate 20 and getter material layer 20*c* as an etching stopper layer.

Next, on the getter material layer 20*c*, a polysilicon layer doped with phosphorous or boron is formed about 0.2 μm thick by sputtering. This polysilicon film corresponds to a gate electrode film. For example, the sputtering is performed in a DC sputtering system by using silicon doped with phosphorous or boron as a target while Ar gas is introduced.

Next, by using a resist pattern (not shown) as a mask, the polysilicon film doped with phosphorous or boron is etched to form a gate electrode 25*a* with a hole (gate hole) 23. The hole (gate hole) 23 is cylindrical and has a diameter of about 0.5 μm and a depth of about 0.2 μm. Thereafter, the resist pattern is removed.

Figure 12B:
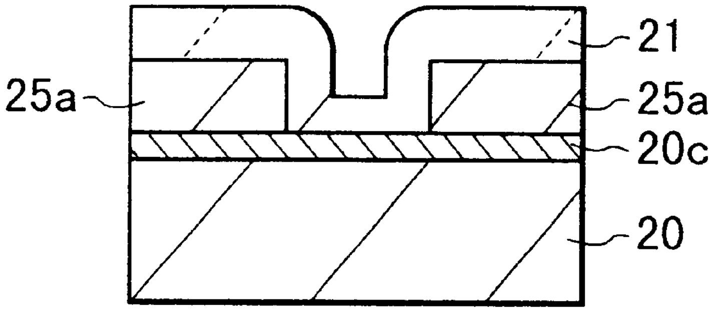

Next, as shown in FIG. 12B, a first sacrificial film (insulating film) 21 of a silicon oxide film is deposited on the gate electrode 25*a* and getter film 20*c* to a thickness of 0.15 μm by CVD. For example, this CVD is performed by using $O_3$ and TEOS as source gas at a substrate temperature of 400° C.

Figure 12C:
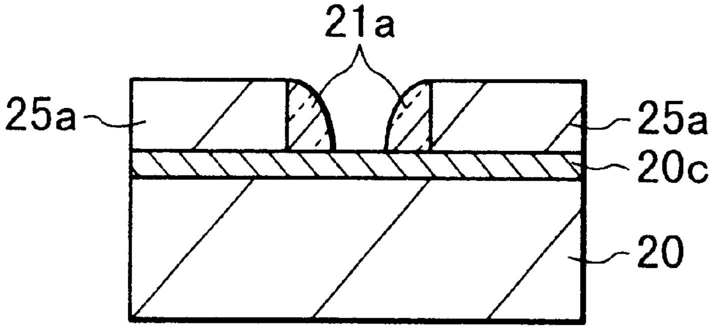

Next, as shown in FIG. 12C, the first sacrificial film 21 is anisotropically etched (etched back) to leave a first sacrificial film 21 a only on the side wall of the gate electrode 25*a* as a side spacer. For example, this etch-back is performed in a magnetron RIE system by using $CHF_3+CO_2$+Ar as etching gas at a reaction chamber pressure of 50 mTorr (about $50\times10^{-3}\times133.3$ Pa).

Figure 12D:
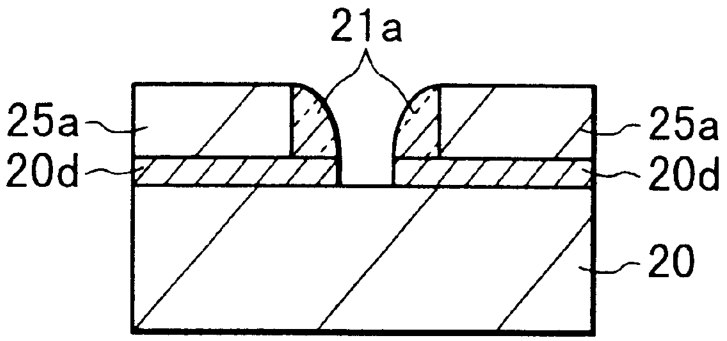

Next, as shown in FIG. 12D, by using the gate electrode 25*a* and side spacer 21 a as a mask, the getter material layer 20*c* is etched to form a getter film 20*d* under the gate electrode 25*a* and side spacer 21*a*. This etching is performed in a magnetron RIE system by using $Cl_2$ as etching gas at a reaction chamber pressure of 125 mTorr (about $125\times10^{-3}\times133.3$ Pa).

Figure 12E:
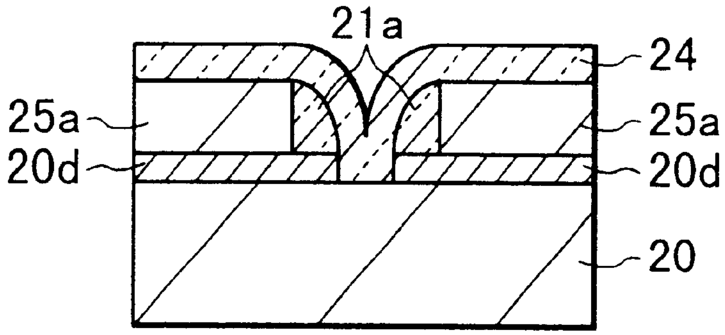

Next, as shown in FIG. 12E, a second sacrificial film (insulating film) 24 is isotropically formed over the substrate to a thickness of about 0.1 μm by atmospheric pressure CVD. This atmospheric pressure CVD is performed by using $O_3$ and TEOS as source gas at a substrate temperature of 400° C.

Figure 12F:
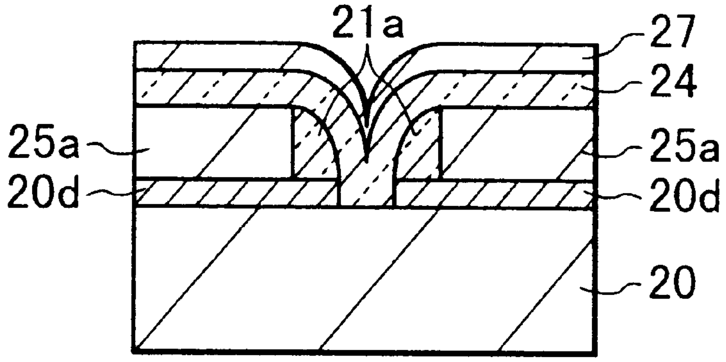

Next, as shown in FIG. 12F, a first emitter electrode 27 of $TiN_x$ is deposited on the second sacrificial film 24 about 0.05 μm thick by reactive sputtering. For example, this reactive sputtering is performed in a DC sputtering system by using Ti as a target while $N_2$+Ar gas is introduced.

Figure 12G:
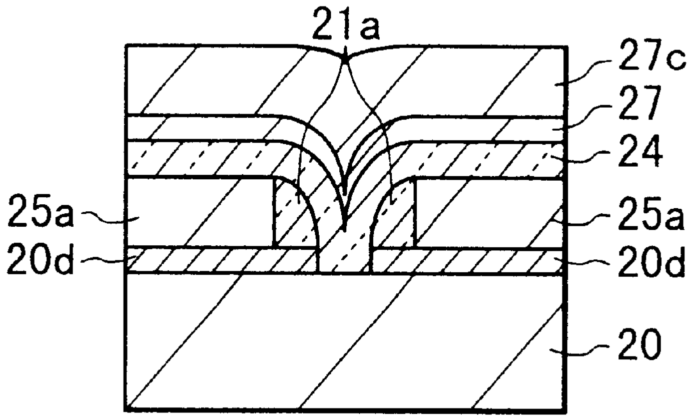

Next, as shown in FIG. 12G, a blanket film 27*c* of W (tungsten) is isotropically deposited on the first emitter electrode 27 about 0.2 μm thick by CVD. For example, CVD is performed under the conditions of source gas of $WF_6+H_2+N_2$+Ar, a pressure of 80 Torr (about 80×133.3 Pa) and a temperature of 450° C. The blanket film 27*c* functions as a second emitter electrode.

Figure 12H:
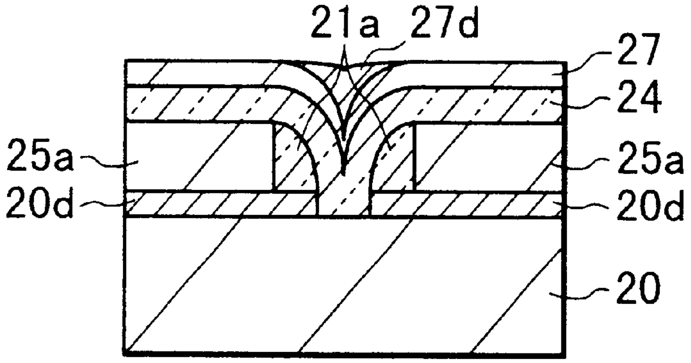

Next, as shown in FIG. 12H, the second emitter electrode 27*c* is anisotropically etched (etched back) about 0.2 μm thick to leave a second emitter electrode 27*d* only in a recess of the first emitter electrode 27. A flat surface of the first emitter electrode 27 is exposed. This etch-back is performed by anisotropic dry-etching. For example, it is performed in a magnetron RIE system by using $SF_6$+Ar+He as etching gas at a reaction chamber pressure of 280 mTorr (about $280\times10^{-3}\times133.3$ Pa).

Figure 12I:
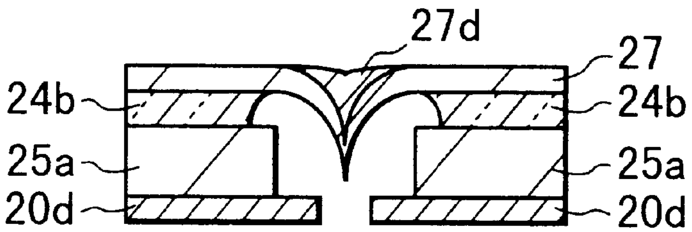

Next, as shown in FIG. 12I, the whole of the substrate 20 and part of the second sacrificial film 24 are etched and removed to leave a peripheral second sacrificial film 24*b* and expose the tip of the first emitter electrode 27. The substrate 20 made of Si is etched by using $HF+HNO_3+CH_3COOH$. The second sacrificial film 24 of a silicon oxide film is etched by $HF+NH_4F$.

With the above processes, a field emission element of a two-electrode structure having the emitter electrodes 27 and 27*d* and gate electrode 25*a* is completed. Since the getter film 20*d* of Ti is a conductive film, it functions as a gate electrode together with the gate electrode 25*a*. This field emission element has the emitter electrodes 27 and 27*d* and gate electrodes 25*a* and 20*d*.

The getter film 20*d* is formed under the gate electrode 25*a* and surrounds the tip of the first emitter electrode 27. By heating the getter film 20*d*, the getter film 20*d* can be activated to improve the vacuum degree in the flat panel display.

FIGS. 13A to 13I are schematic cross sectional views illustrating the manufacture steps of a field emission element according to another modification of the third embodiment of the invention.

Figure 13A:
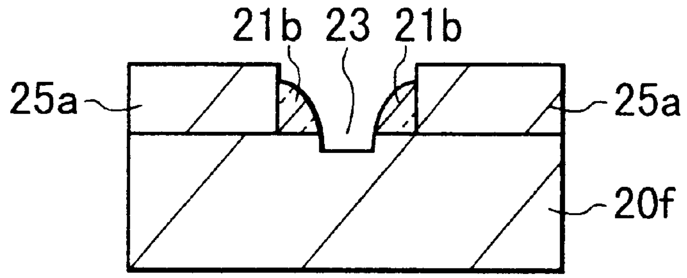
FIGS. 13A to 13I are schematic cross sectional views illustrating the manufacture steps of a field emission element according to another modification of the third embodiment of the invention.

First, the processes shown in FIGS. 11A to 11C are executed. Instead of the getter material layer 22*a* shown in FIG. 11C, a first sacrificial film of a silicon oxide film is used. Thereafter, the process similar to that shown in FIG. 11D is executed. The side spacer 22*b* and substrate 20 are etched about 0.1 $\mu$m thick as shown in FIG. 13A to form a side spacer (silicon oxide film) 21*b* on the side wall of the gate electrode 25*a*. The substrate 20*f* has a recess.

Figure 13B:
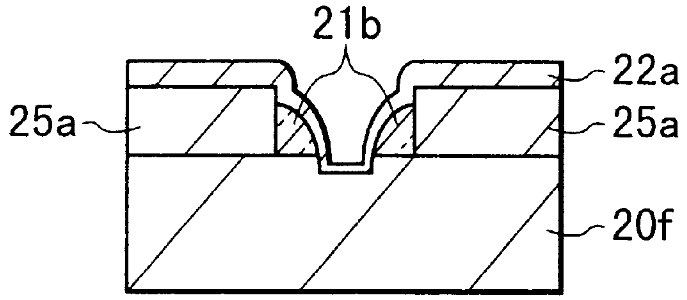

Next, as shown in FIG. 13B, a getter material layer 22*a* of Ti is formed about 0.10 $\mu$m thick over the substrate by sputtering. This sputtering is performed in a DC sputtering system while Ar gas is introduced. Since the recess of the substrate has a small diameter relative to the depth, the getter material layer 22*a* formed on the substrate 20*f* is thinner than that formed on the gate electrode 25*a*. The getter material layer 22*a* functions also as a gate electrode film.

Figure 13C:
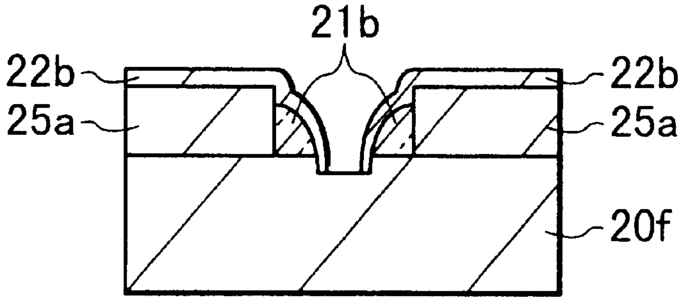

Next, the getter material layer 22*a* is anisotropically etched (etched back) to remove the getter material layer 22*a* on the bottom of the recess. As shown in FIG. 13C, this etch-back forms a getter film 22*b* on the side wall of the recess, on the side spacer 21*b* and on the gate electrode 25*a*. This etch-back is performed by anisotropic dry-etching. For example, it is performed in a magnetron RIE system by using $Cl_2$ as etching gas at a reaction chamber pressure of 125 mTorr (about $125\times10^{-3}\times133.3$ Pa).

Figure 13D:
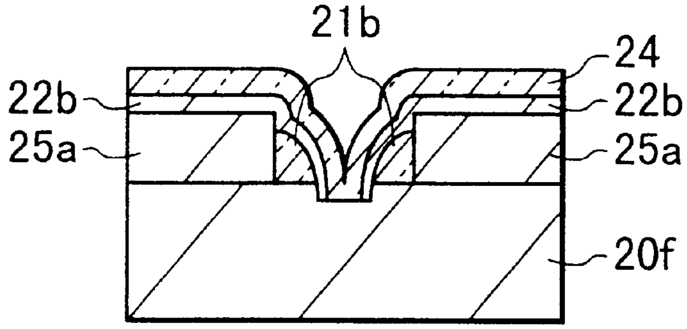

Next, as shown in FIG. 13D, a second sacrificial film (insulating film) 24 of a silicon oxide film or the like is isotropically deposited on the substrate to a thickness of about 0.1 $\mu$m by atmospheric pressure CVD. For example, this atmospheric pressure CVD is performed by using $O_3$ and TEOS as source gas at a substrate temperature of 400° C.

Figure 13E:
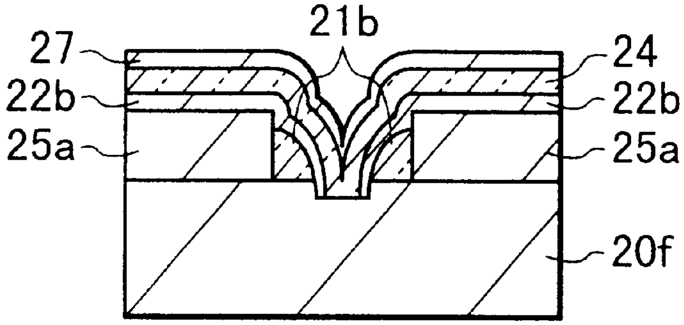

Next, as shown in FIG. 13E, a first emitter electrode 27 of $TiN_x$ is deposited on the second sacrificial film 24 about 0.05 $\mu$m thick by reactive sputtering. This reactive sputtering is performed in a DC sputtering system by using Ti as a target while $N_2$+Ar gas is introduced.

Figure 13F:
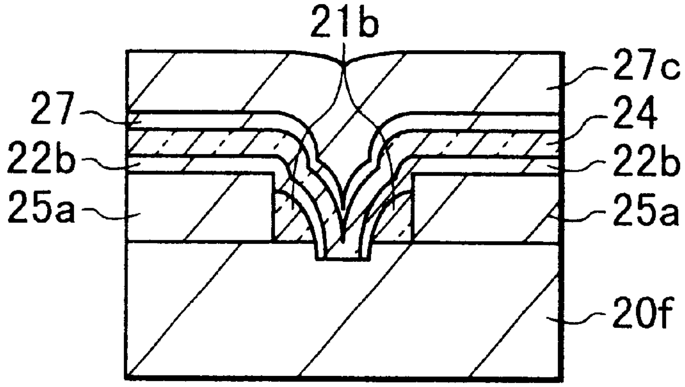

Next, as shown in FIG. 13F, a blanket film 27*c* of W (tungsten) is isotropically deposited on the first emitter electrode 27 about 0.2 $\mu$m thick by CVD. For example, CVD is performed under the conditions of source gas of $WF_6$+$H_2$+$N_2$+Ar, a pressure of 80 Torr (about $80\times133.3$ Pa) and a temperature of 450° C. The blanket film 27*c* functions as a second emitter electrode.

Figure 13G:
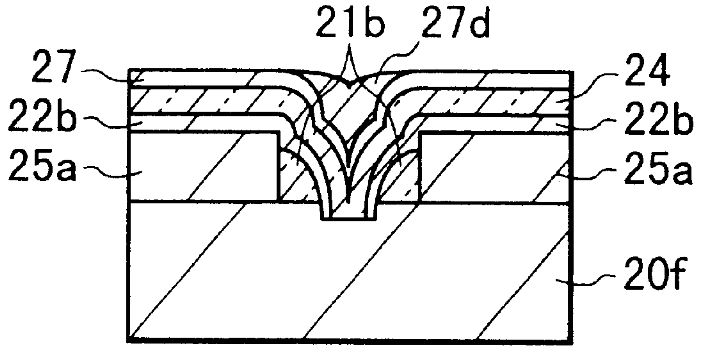

Next, as shown in FIG. 13G, the second emitter electrode 27*c* is anisotropically etched (etched back) about 0.2 $\mu$m thick to leave a second emitter electrode 27*d* only in a recess of the first emitter electrode 27. A flat surface of the first emitter electrode 27 is exposed. This etch-back is performed by anisotropic dry-etching. For example, it is performed in a magnetron RIE system by using $SF_6$+Ar+He as etching gas at a reaction chamber pressure of 280 mTorr (about $280\times10^{-3}\times133.3$ Pa).

Figure 13H:
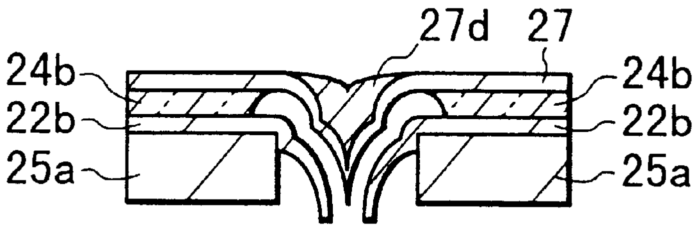

Next, as shown in FIG. 13H, the whole of the substrate 20 and part of the second sacrificial film 24 are etched and removed to leave a peripheral second sacrificial film 24*b* and expose the tip of the first emitter electrode 27. The side spacer (silicon oxide film) 21*b* is etched when the second sacrificial film (silicon oxide film) 24 is etched. The substrate 20 made of Si is etched by using HF+$HNO_3$+$CH_3COOH$. The second sacrificial film 24 of a silicon oxide film is etched by HF+$NH_4F$.

With the above processes, a field emission element of a two-electrode structure having the emitter electrodes 27 and 27*d* and gate electrode 25*a* is completed. Since the emitter electrodes 27*a* and 27*d* has a two-stage shaped structure, the tip thereof can be easily made sharp. Since the getter film (Ti film) 22*b* is a conductive film, it functions as a gate electrode together with the gate electrode 25*a*. This field emission element has the emitter electrodes 27 and 27*d* and gate electrodes 25*a* and 22*b*.

The getter film 22*b* is formed on the gate electrode 25*a* and in the gate hole and surrounds the tip of the first emitter electrode 27. By activating the getter film 22*b*, the vacuum degree in the flat panel display can be improved.

Figure 13I:
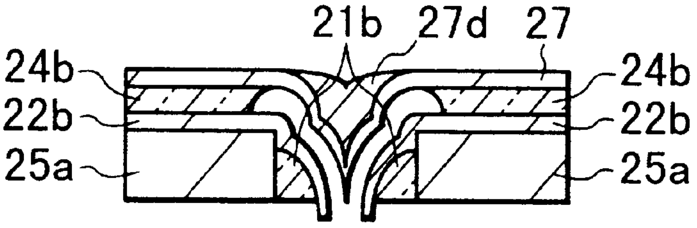

Although a silicon oxide film is used as the side spacer 21*b*, a silicon nitride film may also be used. In this case, the side spacer 21*b* is left even after the etching process, as shown in FIG. 13I. The mechanical strength of the gate electrode 22*b* is therefore reinforced.

FIGS. 14A to 14I are schematic cross sectional views illustrating the manufacture steps of a field emission element according to another modification of the third embodiment of the invention.

Figure 14A:
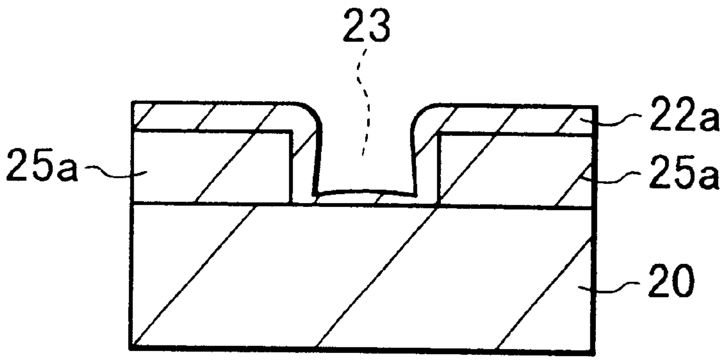
FIGS. 14A to 14I are schematic cross sectional views illustrating the manufacture steps of a field emission element according to another modification of the third embodiment of the invention.

As shown in FIG. 14A, on a substrate 20 of Si or the like, a polysilicon film doped with phosphorous or boron is formed to a thickness of about 0.2 $\mu$m by sputtering. The sputtering conditions are the same as those described with FIG. 12A. By using a resist pattern (not shown) as a mask, the polysilicon film is etched to form a gate electrode 25*a*, shown in FIG. 14A, having a hole (gate hole) 23 on the substrate 20. The hole (gate hole) 23 has a diameter of about 0.5 $\mu$m and a depth of about 0.2 $\mu$m.

Next, as shown in FIG. 14A, a getter material layer 22*a* of Ti is formed on the substrate 20 and gate electrode 25*a* about 0.1 $\mu$m thick by sputtering. For example, the sputtering is performed in a DC sputtering system by using Ti as a target while Ar gas is introduced. The getter material layer 22*a* functions also as a gate electrode film.

Figure 14B:
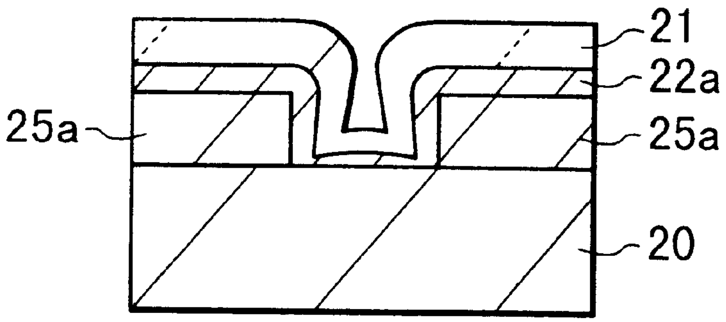

Next, as shown in FIG. 14B, a first sacrificial film (insulating film) 21 of a silicon oxide film is isotropically deposited on the getter material layer 22*a* to a thickness of about 0.15 $\mu$m by CVD. For example, this CVD is performed by using $O_3$ and TEOS as source gas at a substrate temperature of 400° C.

Figure 14C:
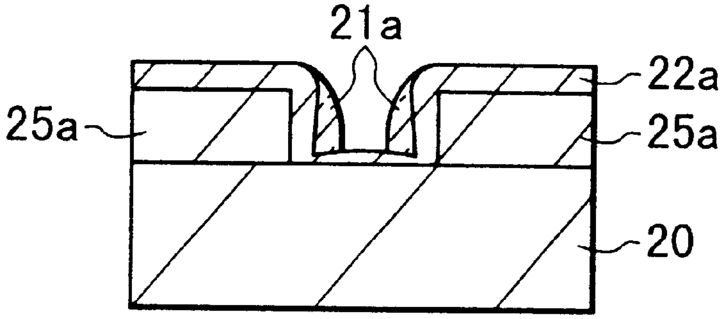

Next, as shown in FIG. 14C, the first sacrificial film 21 is anisotropically etched (etched back) to leave a first sacrificial film 21 a only on the side wall of the hole (gate hole) 23, with the getter material layer 22*a* being interposed therebetween, as a side spacer. For example, this etch-back is performed in a magnetron RIE system by using $CHF_3$+$CO_2$+Ar as etching gas at a reaction chamber pressure of 50 mTorr (about $50\times10^{-3}\times133.3$ Pa).

Figure 14D:
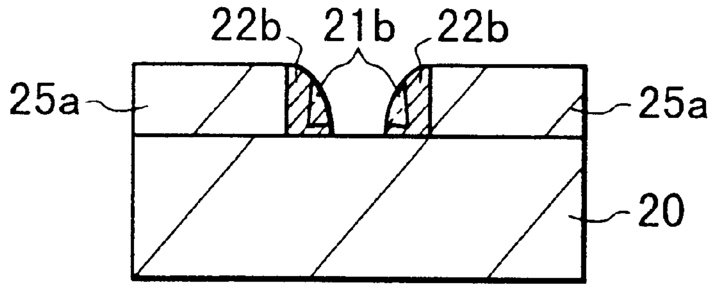

Next, by using the side spacer 21*a* as a mask, the getter material layer 22*a* is etched to remove the getter material layer 22a on the bottom surface of the hole (gate hole) 23 and upper surface of the gate electrode 25a. As shown in FIG. 14D, this etching forms a getter film 22b on the side wall of the gate electrode 25a and leaves the first sacrificial film 21b on the getter film 22b. This etching is performed by anisotropic dry-etching. For example, it is performed in a magnetron RIE system by using $Cl_2$ as etching gas at a reaction chamber pressure of 125 mTorr (about $125\times10^{-3}\times$ 133.3 Pa).

Figure 14E:
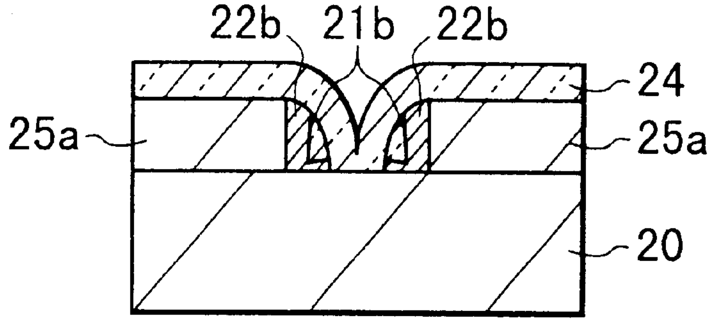

Next, as shown in FIG. 14E, a second sacrificial film (insulating film) 24 of a silicon oxide film is formed over the substrate to a thickness of about 0.1 μm by atmospheric pressure CVD. For example, this atmospheric pressure CVD is performed by using $O_3$ and TEOS as source gas at a substrate temperature of 400° C.

Figure 14F:
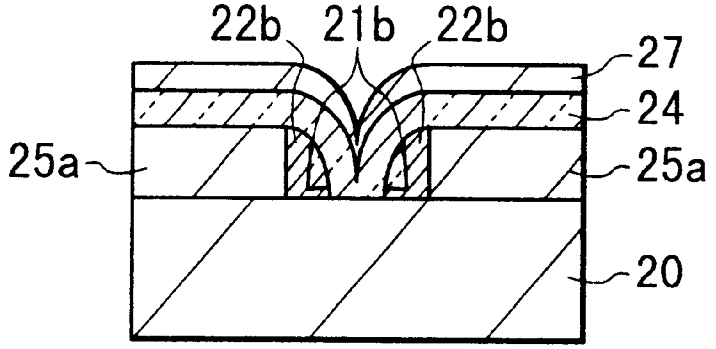

Next, as shown in FIG. 14F, a first emitter electrode 27 of $TiN_x$ is deposited on the second sacrificial film 24 about 0.05 μm thick by reactive sputtering. For example, this reactive sputtering is performed in a DC sputtering system by using Ti as a target while $N_2$+Ar gas is introduced.

Figure 14G:
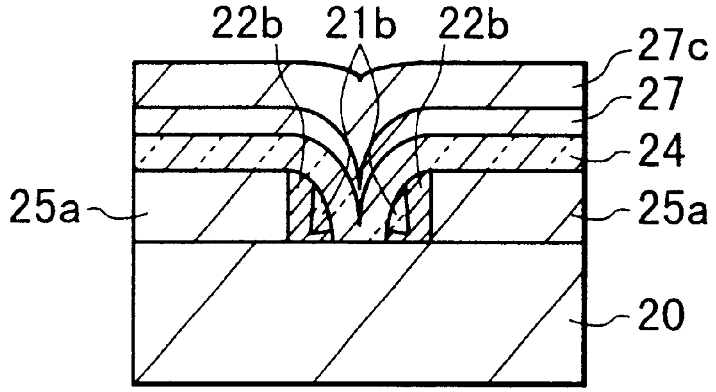

Next, as shown in FIG. 14G, a blanket film 27c of W (tungsten) is isotropically deposited on the first emitter electrode 27 about 0.2 μm thick by CVD. For example, CVD is performed under the conditions of source gas of $WF_6$+$H_2$+$N_2$+Ar, a pressure of 80 Torr (about 80×133.3 Pa) and a temperature of 450° C. The blanket film 27c functions as a second emitter electrode.

Figure 14H:
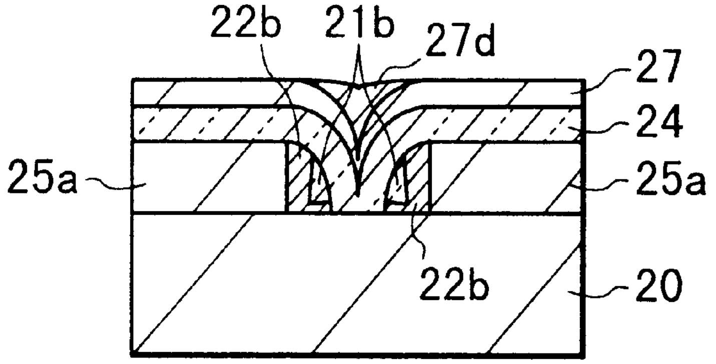

Next, as shown in FIG. 14H, the second emitter electrode 27c is anisotropically etched (etched back) about 0.2 μm thick to leave a second emitter electrode 27d only in a recess of the first emitter electrode 27. A flat surface of the first emitter electrode 27 is exposed. This etch-back is performed by anisotropic dry-etching. For example, it is performed in a magnetron RIE system by using $SF_6$+Ar+He as etching gas at a reaction chamber pressure of 280 mTorr (about $280\times10^{-3}\times133.3$ Pa).

Figure 14I:
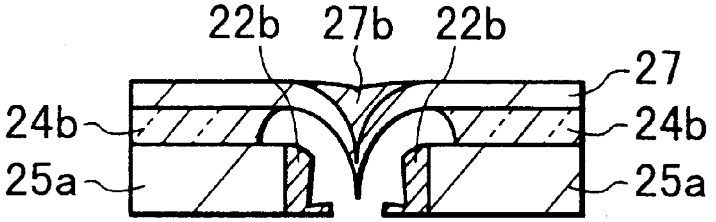

Next, as shown in FIG. 14I, the whole of the substrate 20 and first sacrificial film 21b and part of the second sacrificial film 24 are etched and removed to leave a peripheral second sacrificial film 24b and expose the tip of the first emitter electrode 27. The substrate 20 made of Si is etched by using $HF+HNO_3+CH_3COOH$. The first and second sacrificial films 21b and 24 of a silicon oxide film is etched by $HF+NH_4F$.

With the above processes, a field emission element of a two-electrode structure having the emitter electrodes 27 and 27d and gate electrode 25a is completed. Since the getter film 22b of Ti is a conductive film, it functions as a gate electrode together with the gate electrode 25a. This field emission element has the emitter electrodes 27 and 27d and gate electrodes 25a and 22b.

The getter film 22b is formed on the side wall of the gate hole of the gate electrode 25a, extending inward at the lower portion of the side wall (at the lower portion (lower end) as viewed in FIG. 14I), and surrounds the tip of the first emitter electrode 27. This tip of the emitter electrode 27 extends downward in the gate hole. By activating the getter film 22b, the vacuum degree in the flat panel display can be improved.

In the field emission element shown in FIG. 11I, the space between the emitter electrode 27 and getter film 22b is generally constant. Therefore, a conductive particle (fine grain) may be trapped between the emitter electrode 27 and getter film 22b to electrically short the emitter and gate. In the field emission element shown in FIG. 14I, the space between the emitter electrode 27 and getter film 22b is not constant. Therefore, a conductive particle is hard to be trapped between the emitter electrode 27 and getter film 22b so that an electric short between the emitter and gate can be prevented.

The present invention has been described in connection with the preferred embodiments. The invention is not limited only to the above embodiments. It is apparent that various modifications, improvements, combinations, and the like can be made by those skilled in the art.

As described so far, according to the present invention, it is possible to manufacture a field emission element having a lamination of a gate electrode and a getter film. When a flat panel display is assembled by using such field emission elements, the vacuum degree in the space near the gate electrode can be raised by activating the getter film. The gate electrode is generally formed near the tip of the emitter electrode so that the vacuum degree near the emitter electrode tip can be also raised.

What is claimed is:

1. A method of manufacturing a field emission element comprising the steps of:

(a) forming a lamination on a substrate, the lamination including a gate electrode having a gate hole and a getter film having a hole communicating with the gate hole;

(b) depositing a sacrificial film to form a mold which is used when an emitter electrode is formed, the sacrificial film covering from a surface area of the substrate exposed via the gate hole and the hole to an upper surface area of the lamination;

(c) forming the emitter electrode covering a surface of the mold; and (d) thereafter removing part of the sacrificial film to expose the gate hole and the emitter electrode to thereby obtain the field emission element.

2. A method according to claim 1, wherein said step (a) includes a subsidiary step of forming the getter film made of Ti, Ta, Zr, Al or Mg.

3. A method according to claim 1, wherein said step (a) includes a subsidiary step of forming on the substrate a gate electrode film and a getter material layer in this order.

4. A method according to claim 3, wherein said step (a) includes: a subsidiary step of forming on the substrate a gate electrode film and a getter material layer in this order; a subsidiary step of forming an antireflection film on the getter material layer; a subsidiary step of forming a resist pattern on the antireflection film, while preventing reflection of exposure light by the antireflection film; and a subsidiary step of patterning the getter material layer into the getter film through etching using the resist pattern as a mask.

5. A method according to claim 3, wherein the substrate is a substrate having an anode electrode film, and said step (a) includes a subsidiary step of forming the gate electrode film on the anode electrode film, with an insulating film being interposed therebetween.

6. A method according to claim 1, wherein said step (a) includes a subsidiary step of forming on the substrate a getter material layer and a gate electrode film in this order.

7. A method according to claim 6, wherein said step (a) includes: a subsidiary step of forming on the substrate a getter material layer and a gate electrode film in this order; a subsidiary step of forming an antireflection film on the gate electrode film; a subsidiary step of forming a resist pattern on the antireflection film, while preventing reflection of exposure light by the antireflection film; and a subsidiary step of patterning the gate electrode film into the gate electrode through etching using the resist pattern as a mask.

8. A method according to claim 6, wherein the substrate is a substrate having an anode electrode film, and said step (a) includes a subsidiary step of forming the getter material layer on the anode electrode film, with an insulating film being interposed therebetween.

9. A method according to claim 1, wherein said step (a) includes a subsidiary step of forming the gate electrode having the gate hole and a subsidiary step of forming the getter film on a side wall of the gate hole.

10. A method according to claim 1, wherein said step (b) includes a subsidiary step of forming a side spacer along a side wall of the gate hole.

11. A method according to claim 10, wherein said step (b) includes a subsidiary step of forming a side spacer made of the getter film along the side wall of the gate hole.

12. A method according to claim 1, further comprising a step of (e) reinforcing the emitter electrode before or after said step (d).

13. A method according to claim 12, wherein said step (c) is a step of forming the emitter electrode having a recess on a back surface thereof, the emitter electrode covering the surface of the mold, and said step (e) includes a subsidiary step of filling the recess with a planarizing film.

14. A method according to claim 12, wherein said step (c) is a step of forming the emitter electrode having a recess on a back surface thereof, the emitter electrode covering the surface of the mold, and said step (e) includes a subsidiary step of flowing adhesive into the recess.

15. A method according to claim 12, wherein said step (c) is a step of forming the emitter electrode having a recess on a back surface thereof, the emitter electrode covering the surface of the mold, and said step (e) includes a subsidiary step of forming a blanket film on the recess and a subsidiary step of forming a planarized surface on the blanket film by using a planarizing film.

16. A method according to claim 12, wherein said step (e) includes a subsidiary step of bonding a support substrate to a back surface of the emitter electrode.

17. A method according to claim 12, further comprising a step of (f) forming an emitter wiring line on a back surface of the reinforced emitter electrode, interposing a resistor layer.

18. A method of manufacturing a field emission element comprising the steps of:

(a) forming a gate electrode serving as a getter film having a gate hole on a substrate;

(b) depositing a sacrificial film to form a mold which is used when an emitter electrode is formed, the sacrificial film covering from a surface area of the substrate exposed via the gate hole to an upper surface area of the gate electrode;

(c) forming an emitter electrode covering a surface of the mold; and (d) thereafter removing part of the sacrificial film to expose the gate hole and the emitter electrode to thereby obtain the field emission element.

19. A method according to claim 18 wherein said step (a) includes a subsidiary step of forming a gate electrode film serving as a getter material layer.

20. A method according to claim 18, wherein said step (a) includes a subsidiary step of forming the gate electrode film made of Ti, Ta, Zr, Al or Mg, serving as a getter material layer.

21. A method according to claim 18, wherein said step (a) includes: a subsidiary step of forming a gate electrode film serving as a getter material layer; a subsidiary step of forming an antireflection film on the gate electrode film; a subsidiary step of forming a resist pattern on the antireflection film, while preventing reflection of exposure light by the antireflection film; and a subsidiary step of patterning the gate electrode film into the gate electrode through etching using the resist pattern as a mask.

22. A method according to claim 18, wherein the substrate is a substrate having an anode electrode film, and said step (a) includes a subsidiary step of forming a gate electrode film serving as a getter material layer on the anode electrode film, with an insulating film being interposed therebetween.

23. A method according to claim 18, wherein said step (b) includes a subsidiary step of forming a side spacer along a side wall of the gate hole.

24. A method according to claim 18, further comprising a step of (e) reinforcing the emitter electrode before or after said step (d).

25. A method according to claim 24, wherein said step (c) is a step of forming the emitter electrode having a recess on a back surface thereof, the emitter electrode covering the surface of the mold, and said step (e) includes a subsidiary step of filling the recess with a planarizing film.

26. A method according to claim 24, wherein said step (c) is a step of forming the emitter electrode having a recess on a back surface thereof, the emitter electrode covering the surface of the mold, and said step (e) includes a subsidiary step of flowing adhesive into the recess.

27. A method according to claim 24, wherein said step (c) is a step of forming the emitter electrode having a recess on a back surface thereof, the emitter electrode covering the surface of the mold, and said step (e) includes a subsidiary step of forming a blanket film on the recess and a subsidiary step of forming a planarized surface on the blanket film by using a planarizing film.

28. A method according to claim 24, wherein said step (e) includes a subsidiary step of bonding a support substrate to a back surface of the emitter electrode.

29. A method according to claim 24, further comprising a step of (f) forming an emitter wiring line on a back surface of the reinforced emitter electrode, interposing a resistor layer.

30. A method of manufacturing a field emission element comprising the steps of:

(a) forming a conductive gate electrode film on a surface of a substrate;

(b) forming a getter material layer on the gate electrode film;

(c) forming a resist pattern on the getter material layer through photolithography;

(d) by using the resist pattern as an etching mask, etching the getter material layer to form a hole therethrough reaching the gate electrode film, to thus form a getter film;

(e) by using either the resist pattern or the getter film as an etching mask, etching the gate electrode film to form a gate hole therethrough reaching the substrate, to thus form a gate electrode having the gate hole;

(f) removing the resist pattern before or after said step (e);

(g) forming a first sacrificial film over the substrate, the first sacrificial film covering the gate electrode and the getter film;

(h) etching back the first sacrificial film to leave a side spacer on a side wall of the gate hole of the gate electrode and/or on a side wall of the hole of the getter film;

(i) forming a second sacrificial film over the substrate, the second sacrificial film covering the getter film, the gate electrode and the side spacer;

(j) forming a conductive emitter electrode on the second sacrificial film; and (k) removing at least part of the second sacrificial film to expose the emitter electrode.

31. A method according to claim 30, wherein the substrate is a substrate having an anode electrode film, and said step (a) is a step of forming the gate electrode film on the anode electrode film, with an insulating film being interposed therebetween.

32. A method according to claim 30, wherein said step (b) is a step of forming the getter material layer of Ti, Ta, Zr, Al or Mg.

33. A method of manufacturing a field emission element comprising the of:

(a) forming a getter material layer on a surface of a substrate;

(b) forming a conductive gate electrode film on the getter material layer;

(c) forming a resist pattern on the gate electrode film through photolithography;

(d) by using the resist pattern as an etching mask, etching the gate electrode film to form a gate hole therethrough reaching the getter material layer, to thus form a gate electrode having the gate hole;

(e) by using either the resist pattern or the gate electrode as an etching mask, etching the getter material layer to form a hole therethrough reaching the substrate, to thus form a getter film;

(f) removing the resist pattern before or after said step (e);

(g) forming a first sacrificial film over the substrate, the first sacrificial film covering the gate electrode and the getter film;

(h) etching back the first sacrificial film to leave a side spacer on a side wall of the hole of the getter film and on a side wall of the gate hole of the gate electrode, or on a side wall of the hole of the getter film;

(i) forming a second sacrificial film over the substrate, the second sacrificial film covering the gate electrode, the getter film and the side spacer;

(j) forming a conductive emitter electrode on the second sacrificial film; and (k) removing at least part of the second sacrificial film to expose the emitter electrode.

34. A method according to claim 33, wherein the substrate is a substrate having an anode electrode film, and said step (a) is a step of forming the gate electrode film on the anode electrode film, with an insulating film being interposed therebetween.

35. A method according to claim 33, wherein said step (b) is a step of forming the getter material layer made of Ti, Ta, Zr, Al or Mg.

36. A method of manufacturing a field emission element comprising the steps of:

(a) forming a conductive gate electrode film on a surface of a substrate, the gate electrode film being made of getter material;

(b) forming a resist pattern on the gate electrode film through photol ithography;

(c) by using the resist pattern as an etching mask, etching the gate electrode film to form a gate hole therethrough reaching the substrate, to thus form a gate electrode serving as a getter film having the gate hole;

(d) removing the resist pattern;

(e) forming a first sacrificial film over the substrate, the first sacrificial film covering the gate electrode;

(f) etching back the first sacrificial film to leave a side spacer on a side wall of the gate hole of the gate electrode;

(g) forming a second sacrificial film over the substrate, the second sacrificial film covering the side spacer;

(h) forming a conductive emitter electrode on the second sacrificial film; and (j) removing at least part of the second sacrificial film to expose the emitter electrode.

37. A method according to claim 36, wherein the substrate is a substrate having an anode electrode film, and said step (a) is a step of forming the conductive gate electrode film made of the getter material on the anode electrode film, with an insulating film being interposed therebetween.

38. A method according to claim 36, wherein said step (a) is a step of forming the conductive gate electrode film made of the getter material of Ti, Ta, Zr, Al or Mg.

39. A method of manufacturing a field emission element comprising the steps of:

(a) forming a gate electrode film on a surface of a substrate;

(b) forming a resist pattern on the gate electrode film through photolithography;

(c) by using the resist pattern as an etching mask, etching the gate electrode film to form a gate hole therethrough reaching the substrate, to thus form a gate electrode having the gate hole;

(d) removing the resist pattern;

(e) forming a getter material layer over the substrate, the getter material layer covering the gate electrode;

(f) etching back the getter material layer to form a getter film on a side wall of the gate electrode, the getter film also functioning as a side spacer;

(f) forming a first sacrificial film over the substrate, the first sacrificial film covering the gate electrode and the getter film;

(h) forming an emitter electrode on the first sacrificial film; and (i) removing at least part of the first sacrificial film to expose the emitter electrode.

40. A method according to claim 39, wherein the substrate is a substrate having an anode electrode film, and said step (a) is a step of forming the gate electrode film on the anode electrode film, with an insulating film being interposed therebetween.

41. A method according to claim 39, wherein said step (e) is a step of forming the getter material layer made of Ti, Ta, Zr, Al or Mg.

42. A method of manufacturing a field emission element comprising the steps of:

(a) forming a gate electrode film on a surface of a substrate;

(b) forming a resist pattern on the gate electrode film through photolithography;

(c) by using the resist pattern as an etching mask, etching the gate electrode film to form a gate hole therethrough reaching the substrate, to thus form a gate electrode having the gate hole;

(d) removing the resist pattern;

(e) forming a getter material layer over the substrate, the getter material layer covering the gate electrode including a side wall and a bottom surface of the gate hole;

(f) forming a first sacrificial film over the substrate, the first sacrificial film covering the getter material layer and not filling the gate hole;

(g) etching back the first sacrificial film to form a side spacer on a side wall of the getter material layer and on the side wall of the gate electrode and expose the getter material layer at the bottom surface of the gate hole;

(h) by using the side spacer as an etching mask, etching the getter material layer to remove at least the getter material layer at the bottom surface of the gate hole, to thus form a getter film having a hole reaching the substrate;

(i) forming a second sacrificial film over the substrate, the second sacrificial film covering the side spacer, the getter film and the gate electrode;

(j) forming an emitter electrode on the second sacrificial film; and (k) removing at least part of the second sacrificial film to expose the emitter electrode.

43. A method according to claim 42, wherein the substrate is a substrate having an anode electrode film, and said step (a) is a step of forming the gate electrode film on the anode electrode film, with an insulating film being interposed therebetween.

44. A method according to claim 42, wherein said step (e) is a step of forming the getter material layer made of Ti, Ta, Zr, Al or Mg.

* * * * *